(12) United States Patent
Horioka et al.

(10) Patent No.: US 7,374,636 B2
(45) Date of Patent: May 20, 2008

(54) METHOD AND APPARATUS FOR PROVIDING UNIFORM PLASMA IN A MAGNETIC FIELD ENHANCED PLASMA REACTOR

(75) Inventors: Keiji Horioka, Chiba (JP); Chun Yan, San Jose, CA (US); Taeho Shin, San Jose, CA (US); Roger Alan Lindley, Santa Clara, CA (US); Panyin Hughes, Gaithersburg, MD (US); Douglas H. Burns, Saratoga, CA (US); Evans Y. Lee, Milpitas, CA (US); Bryan Y. Pu, San Jose, CA (US); Qi Li, San Jose, CA (US); Mahmoud Dahimene, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 10/205,870

(22) Filed: Jul. 26, 2002

(65) Prior Publication Data

US 2003/0006008 A1    Jan. 9, 2003

Related U.S. Application Data

(63) Continuation-in-part of application No. 10/146,443, filed on May 14, 2002.

(30) Foreign Application Priority Data

Jul. 6, 2001    (JP)    ............... 2001-206905
Oct. 31, 2001   (JP)    ............... 2001-335364

(51) Int. Cl.
    *H01L 21/306*   (2006.01)
    *C23C 16/00*    (2006.01)
(52) U.S. Cl. ............... 156/345.46; 118/723 E

(58) Field of Classification Search ............. 118/723 I, 118/723 IR, 723 AN, 723 E, 723 MR, 723 MA; 156/345.48, 345.49, 345.42, 345.46, 345.47
See application file for complete search history.

(56) References Cited

U.S. PATENT DOCUMENTS

| | | |
|---|---|---|
| 4,526,643 A | 7/1985 | Okano |
| 4,552,639 A | 11/1985 | Garrett |
| 4,600,492 A | 7/1986 | Ooshio |
| 4,631,106 A | 12/1986 | Nakazato |
| 4,668,338 A | 5/1987 | Maydan |
| 4,668,365 A | 5/1987 | Foster |
| 4,740,268 A | 4/1988 | Bukhman |
| 4,829,215 A | 5/1989 | Kim |
| 4,842,683 A | 6/1989 | Cheng |
| 4,919,783 A | 4/1990 | Asamaki |
| 4,950,956 A | 8/1990 | Asamaki |

(Continued)

FOREIGN PATENT DOCUMENTS

EP    0852389 A2 *    7/1998

*Primary Examiner*—Luz Alejandro-Mulero
(74) *Attorney, Agent, or Firm*—Moser IP Law Group

(57) ABSTRACT

A method and apparatus for controlling a magnetic field gradient within a magnetically enhanced plasma reactor. The apparatus comprises a cathode pedestal supporting a wafer within an enclosure, a plurality of electromagnets positioned proximate the enclosure for producing a magnetic field in the enclosure and a magnetic field control element, positioned proximate the electromagnets, for controlling the magnetic field proximate a specific region of the wafer.

16 Claims, 18 Drawing Sheets

U.S. PATENT DOCUMENTS

| | | |
|---|---|---|
| 4,963,242 A | 10/1990 | Sato et al. ............. 204/298.31 |
| 5,032,202 A | 7/1991 | Tsai |
| 5,061,838 A | 10/1991 | Lane |
| 5,079,481 A | 1/1992 | Moslehi |
| 5,081,398 A | 1/1992 | Asmussen |
| 5,087,857 A | 2/1992 | Ahn |
| 5,122,251 A | 6/1992 | Campbell |
| 5,208,512 A | 5/1993 | Forster |
| 5,211,825 A | 5/1993 | Saito |
| 5,215,619 A | 6/1993 | Cheng et al. |
| 5,225,024 A | 7/1993 | Hanley et al. ............... 156/345 |
| 5,252,194 A | 10/1993 | Demaray |
| 5,304,279 A | 4/1994 | Coultas |
| 5,308,417 A | 5/1994 | Groechel |
| 5,444,207 A | 8/1995 | Sekine et al. ......... 219/121.43 |
| 5,449,977 A | 9/1995 | Nakagawa et al. ..... 315/111.51 |
| 5,519,373 A | 5/1996 | Miyata |
| 5,534,108 A * | 7/1996 | Qian et al. .................... 216/68 |
| 5,659,276 A | 8/1997 | Miyata |
| 5,674,321 A | 10/1997 | Pu et al. .............. 118/723 MR |
| 5,717,294 A | 2/1998 | Sakai et al. |
| 5,718,795 A | 2/1998 | Plavidal |
| 5,783,102 A | 7/1998 | Keller |
| 5,798,029 A | 8/1998 | Morita |
| 5,855,725 A | 1/1999 | Sakai |
| 5,876,576 A | 3/1999 | Fu |
| 5,902,461 A | 5/1999 | Xu |
| 5,907,220 A | 5/1999 | Tepman |
| 5,945,008 A | 8/1999 | Kisakibaru |
| 6,014,943 A | 1/2000 | Arami |
| 6,015,476 A | 1/2000 | Schlueter et al. |
| 6,030,486 A | 2/2000 | Loewenhardt |
| 6,051,151 A | 4/2000 | Keller |
| 6,063,236 A | 5/2000 | Sakai |
| 6,082,293 A | 7/2000 | Kawashima |
| 6,085,688 A | 7/2000 | Lymberopoulos |
| 6,099,687 A | 8/2000 | Yamazaki |
| 6,113,731 A | 9/2000 | Shan et al. ................. 156/345 |
| 6,143,140 A | 11/2000 | Wang |
| 6,164,240 A | 12/2000 | Nikulin |
| 6,190,495 B1 | 2/2001 | Kubota |
| 6,228,235 B1 | 5/2001 | Tepman |
| 6,247,425 B1 | 6/2001 | Lymberopoulos |
| 6,251,242 B1 | 6/2001 | Fu |
| 6,255,220 B1 | 7/2001 | Kisakibaru |
| 6,274,008 B1 | 8/2001 | Gopalraja |
| 6,277,249 B1 | 8/2001 | Gopalraja |
| 6,296,747 B1 | 10/2001 | Tanaka |
| 6,300,227 B1 | 10/2001 | Liu |
| 6,322,661 B1 * | 11/2001 | Bailey et al. .......... 156/345.49 |
| 6,376,388 B1 | 4/2002 | Hashimoto |
| 6,382,129 B1 | 5/2002 | Nikulin |
| 6,436,230 B1 | 8/2002 | Kondo |
| 6,444,104 B2 | 9/2002 | Gopalraja |
| 6,451,177 B1 | 9/2002 | Gopalraja |
| 6,485,617 B2 | 11/2002 | Fu |
| 6,485,618 B2 | 11/2002 | Gopalraja |
| 6,488,807 B1 | 12/2002 | Collins |
| 6,491,801 B1 | 12/2002 | Gung |
| 6,495,009 B1 | 12/2002 | Gung |
| 6,521,082 B1 | 2/2003 | Barnes |
| 6,528,751 B1 | 3/2003 | Hoffman |
| 6,545,580 B2 | 4/2003 | Hegde |
| 6,579,421 B1 | 6/2003 | Fu |
| 6,599,399 B2 | 7/2003 | Xu |
| 6,610,184 B2 | 8/2003 | Ding |
| 6,613,689 B2 | 9/2003 | Liu |
| 6,627,050 B2 | 9/2003 | Miller |
| 6,663,754 B2 | 12/2003 | Gung |
| 6,673,199 B1 | 1/2004 | Yamartino |
| 6,716,302 B2 | 4/2004 | Carducci |
| 6,761,804 B2 | 7/2004 | Perrin |
| 6,764,575 B1 | 7/2004 | Yamasaki |
| 6,787,006 B2 | 9/2004 | Gopalraja |
| 6,797,639 B2 | 9/2004 | Carducci |
| 6,805,770 B1 | 10/2004 | Oster |
| 2005/0167051 A1 | 8/2005 | Hoffman |

* cited by examiner

METHOD AND APPARATUS FOR PROVIDING UNIFORM PLASMA IN A MAGNETIC FIELD ENHANCED PLASMA REACTOR

CROSS REFERENCE TO RELATED APPLICATION

This application is a continuation-in-part of U.S. patent application Ser. No. 10/146,443, filed May 14, 2002, entitled "Method and Apparatus for Controlling the Magnetic Field Intensity in a Plasma Enhanced Semiconductor Wafer Processing Chamber," which is herein incorporated by reference in its entirety, and which claims the benefit of the filing dates of Japanese Patent Applications having Serial Nos. 2001-335364 filed Oct. 31, 2001, and 2001-206905 filed Jul. 6, 2001.

BACKGROUND OF THE INVENTION

1. Field of the Invention

The invention generally relates to semiconductor wafer processing chambers employing magnetically enhanced plasmas. More particularly, the invention relates to a method and apparatus for providing uniform plasma in a magnetically enhanced plasma reactor.

2. Description of the Related Art

Semiconductor wafer processing chambers commonly employ plasmas to enhance the performance of various processes for fabricating semiconductor devices on silicon wafers or other workpieces. Such processes include sputter etching, plasma enhanced chemical etching, plasma enhanced chemical vapor deposition, and ionized sputter deposition. The high energy level of reagents in the plasma generally increases the rate of the fabrication process, and also reduces the temperature at which the semiconductor workpiece must be maintained to perform the process.

Magnetically enhanced plasma chambers (also referred to as reactors) employ magnetic fields to increase the density of charged particles in the plasma thereby further increasing the rate of the plasma enhanced fabrication process. Increasing the process rate is highly advantageous because the cost of fabricating semiconductor devices is directly proportional to the time required for fabrication.

Despite this advantage, many plasma chambers in commercial use do not employ magnetic enhancement because the magnetic enhancement has been found to increase the likelihood of damaging the semiconductor devices on the wafer. Such damage is caused by non-uniform electron density across a wafer due to the spatial contour of the magnetic field being poorly optimized.

FIG. 1 depicts a schematic cross section view of a magnetically enhanced plasma chamber 5 suitable for either etching or chemical vapor deposition in accordance with the prior art. FIG. 2 depicts a top cross sectional view of the chamber 5. The vacuum chamber 5 is enclosed by a octagonal sidewall 12, circular bottom wall 14 and circular top wall or lid 16. The lid 16 and bottom wall 14 may be either dielectric or metal. An electrically grounded anode electrode 18 is mounted at the bottom of the lid 16. The anode electrode may be perforated to function as a gas inlet through which process gas enters the chamber. The side wall 12 may be either dielectric or metal. If it is metal, the metal must be nonmagnetic material such as anodized aluminum so as to not interfere with the magnetic field created by an array of electromagnetic coils 6, 7, 8, and 9 located outside the chamber 5. If the side wall is metal, it will function as part of the anode.

The semiconductor wafer or workpiece 20 is mounted on a cathode electrode 22, which, in turn, is mounted in the lower end of the chamber 5. A vacuum pump, not shown, exhausts gases from the chamber 5 through an exhaust manifold 23 and maintains the total gas pressure in the chamber 5 at a level low enough to facilitate creation of a plasma, typically in the range of 10 millitorr to 20 torr, with pressure at the lower and higher end of the range being typical for etching or CVD processes, respectively.

An RF power supply 24 is connected to the cathode pedestal 22 through a series coupling capacitor 26. The RF power supply 24 provides an RF voltage between the cathode pedestal 22 and the grounded anode electrode 18 that excites the gases within the chamber into a plasma state. The plasma body has a time average positive DC potential or voltage relative to the cathode or anode electrodes that accelerates ionized process gas constituents to bombard the cathode and anode electrodes.

Magnetic enhancement of the plasma most commonly is implemented by a DC magnetic field in the region between the cathode and anode electrodes. The direction of the magnetic field is usually transverse to the longitudinal axis of the chamber 5, i.e., transverse to the axis extending between the cathode and anode electrodes. Various arrangements of permanent magnets or electromagnets are conventionally used to provide such a transverse magnetic field. One such arrangement is the pair of coils 6, 7 shown in FIG. 1 disposed on opposite sides of the cylindrical chamber side wall 12. FIG. 2 depicts a top, cross-sectional view of the chamber of FIG. 1 that shows the orientation of opposing coil pairs 6, 7, 8 and 9. Generally, the diameter of each coil approximately equals the spacing between the two coils. Each pair of opposing coils 6, 7, 8 and 9 are connected in series and in phase to a DC power supply, not shown, so that they produce transverse magnetic fields which are additive in the region between the coil pairs. This transverse magnetic field is represented in FIGS. 1 and 2 by the vector B oriented along the negative X axis. An example of such a magnetically enhanced plasma chamber is described in commonly assigned U.S. Pat. No. 5,215,619, issued Jun. 1, 1993, which is hereby incorporated by reference in its entirety.

Because the plasma has a positive time average potential or voltage relative to the cathode electrode 22, the time average electric field E in the plasma pre-sheath adjacent the cathode will be directed downward from the plasma toward the cathode, thereby giving the free electrons in the pre-sheath a drift velocity vector whose time average values oriented upward towards the plasma body, as represented by vector $v_e$ in FIG. 1. In response to the DC magnetic field vector B, these free electrons will primarily experience a qvxB force, causing the electrons and ions to move in a helical shaped path. In additional, the electrons and ions will experience another time-averaged force due to the combination of the helical motion and the electric field. This is commonly called the ExB drift, where the direction of the drift is approximately coplanar with the semiconductor wafer 20 and orthogonal to the magnetic field vector B as illustrated in FIG. 2 by the ExB vector oriented along the Y axis.

In this discussion, the term "time average" means averaged over one period of the RF frequency or frequencies at which the plasma is excited, this period typically being less than $10^{-7}$ seconds. This time average over one RF period is unrelated to the time averaging due to the optional rotation of the magnetic field relative to the workpiece that typically has a rotation period on the order of 0.2 to 4 seconds.

It is believed that the ExB drift of free electrons is a major source of semiconductor device damage in conventional magnetically enhanced plasma chambers. Specifically, it is believed that ExB drift can unevenly distribute the free electrons in the plasma pre-sheath and cause non-uniformity in the ion flux. It is believed that this spatial nonuniformity of the ion flux that bombards the wafer produces electrical currents in the wafer which often damages the semiconductor devices on the wafer.

Conventional magnetically enhanced plasma chambers attempt to ameliorate this nonuniformity by slowly rotating the magnetic field relative to the wafer, typically at a rotation frequency in the range of one quarter to five rotations per second. In some designs, the wafer 20 or the magnets 6, 7, 8 and 9 are physically rotated. In other designs, as illustrated in FIG. 2, the rotation is performed electronically by providing two pairs of coils 6, 7 and 8, 9 that are arranged orthogonally to one another. The magnetic field can be rotated in 90° increments by successively and periodically connecting the DC power supply to the first coil pair 6, 7 with positive polarity (2) to the second coil pair 8, 9 with positive polarity; (3) to the first coil pair 6, 7 with negative polarity; and (4) to the second coil pair 8, 9 with negative polarity. Alternatively, the magnetic field can be rotated continuously by replacing the DC power supply with a very low frequency (in the range of 0.1-10 Hz) power supply having quadrature outputs connected to provide current to the first coil pair 6, 7 offset in phase by 90° from the current provided in the second coil pair 8, 9.

Rotating the magnetic field relative to the wafer greatly reduces the time average spatial non-uniformity in the ion flux bombarding the wafer, and therefore can provide acceptable spatial uniformity of etch rate (in an etching chamber) or deposition rate (in a CVD chamber) on the wafer surface. However, rotating the magnetic field does not in any way improve the instantaneous spatial uniformity of ion flux on the wafer surface, and therefore does not completely solve the problem of semiconductor device damage in magnetically enhanced plasma chambers.

U.S. Pat. No. 6,113,731, issued Sep. 5, 2000, discloses a method and apparatus that further combats the ExB drift problem by driving current through the adjacent coil pairs 6, 9 and 7, 8 such that a magnetic field gradient is generated laterally across the surface of the wafer.

In FIG. 2, the magnetic field produced by driving a first current through coils 7, 8 is represented by arrow 10 and the magnetic field produced by driving a second current through coils 6, 9 is represented by the arrows 11. The first current is less than the second current such that the magnetic field 10 is smaller than magnetic field 11 such that a magnetic field gradient is produced. The ratio of the currents controls the gradient. This ratio is optimized for each process regime to create a nearly uniform plasma. For most process regimens the ratio is in the range 0.1 to 0.7. This non-uniform magnetic field produces a more uniform ion flux within the chamber by increasing the magnetic field magnitude in the region of the wafer formerly with low etch rate, and by decreasing the magnetic field magnitude in the region of the wafer formerly with high etch rate. This magnetic field gradient is then adjusted to the optimum shape that can provide a minimum ion flux uniformity for each process condition. The optimum magnetic field gradient is dependent upon the hardware configuration used to produce the magnetic fields. As smaller and smaller feature sizes are used on wafers, the requirements for producing a nearly uniform ion flux continue to become more stringent, especially in certain process regimes, in order to prevent damage to the electrical circuitry formed on the wafer. Therefore, there is a need in the art for a method and apparatus for controlling the magnetic field gradient within a magnetically enhanced plasma chamber.

SUMMARY OF THE INVENTION

The disadvantages associated with the prior art are overcome by a method and apparatus of providing improved control over the magnetic field gradient within a magnetically enhanced plasma reactor to produce a uniform plasma. Generally, the invention uses a magnetic field control element for controlling the magnetic field proximate a specific region of a wafer within the reactor. In a first embodiment of the invention, the main magnetic coils are supplemented with counter coils that function as magnetic field control elements. The counter coils have oppositely directed currents flowing in each coil. The counter coils are positioned concentrically within the conventional magnetic coils. The counter coils provide a magnetic field that moderates the magnitude of the magnetic field produced by the main coils.

In another embodiment of the invention, a magnetic shunt ring is positioned to circumscribe the wafer proximate the edge of the wafer. The shunt ring suppresses the magnetic field near the edge of the wafer to reduce the magnitude of the field strength at the wafer edge. In another embodiment of the invention, a metal insert is positioned in the plane of each of the conventional magnetic coils. In another embodiment of the invention, one of the magnetic coil pairs is divided into a sub-pair of coils such that the reactor is circumscribed by six coils i.e., one coil on each of two opposing sides and two coils on each of the other two opposing sides. In another embodiment of the invention, a substantial number of coils are positioned about the reactor, i.e. 16 coils are provided about the reactor. In another embodiment, magnetic shields are positioned in the corners between adjacent coils to produce a suppressive magnetic field that is directed counter to the direction of the main field. In another embodiment, magnetic shields are positioned between the coils and the pedestal to alter the magnetic field proximate a specific region of the wafer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
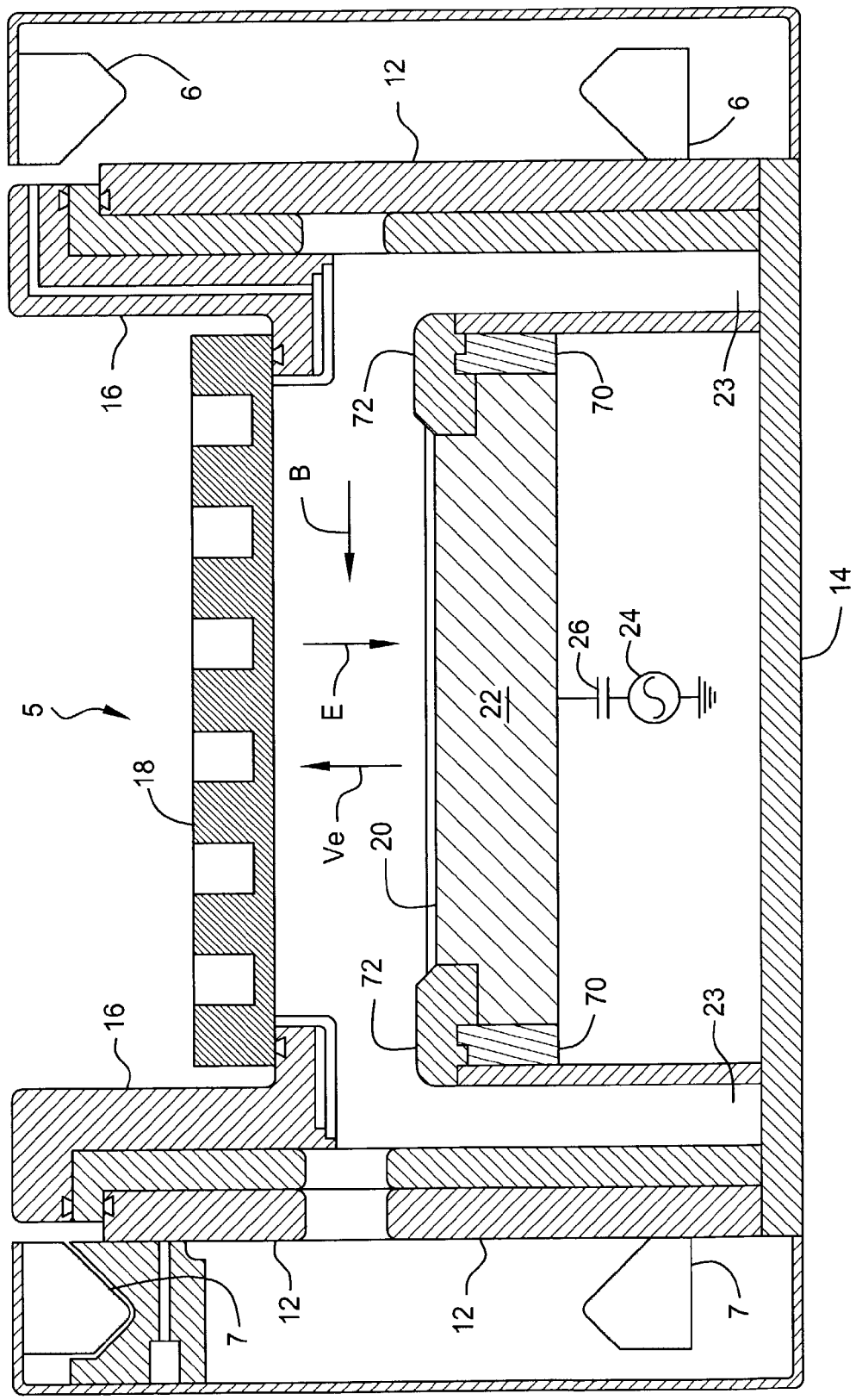
FIG. 1 is a schematic, longitudinal cross sectional view of a prior art magnetically enhanced plasma chamber.

The present invention comprises various methods and apparatus that provide a substantially uniform plasma within a plasma enhanced reaction reactor through the control of a magnetic field gradient produced within the reactor. As coil pairs are driven to produce a magnetic field (B-field) in a reactor having a configurable magnetic field (CMF), the B-field is high nearest the adjacent coils, i.e., the field strength is highest in the corner, and decreases across the wafer. Such a reactor is the eMxP+ Dielectric Etch reactor manufactured by Applied Materials, Inc. of Santa Clara, Calif. This reactor is the subject of U.S. Pat. No. 6,113,731, issued Sep. 5, 2000, which is incorporated herein by reference.

In a CMF reactor as discussed above with respect to FIG. 2, the adjacent coil pairs 7, 8 and 6, 9 are driven in series from a current source to establish a B-field 10 and 11 between each of the coil pairs 7, 8 and 6, 9. Generally, one pair of coils 6, 9 is driven with more current than the opposing coil pair 7, 8 to produce a magnetic field gradient laterally across the surface of the wafer 20. The magnitude of the B-field at a distance from the coils can be adjusted by adjusting the current ratio between coil pairs 7, 8 and 6, 9. Generally the current ratio is in the range 0.1 to 0.7. However, for the typical ratio range, the field strength near the high current coils is not sensitive to the ratio of currents. The present invention comprises a magnetic field control element that controls the B-field near the high current coils to achieve a more controlled magnetic field gradient that results in a uniform plasma.

1. Counter Coils

Figure 2:
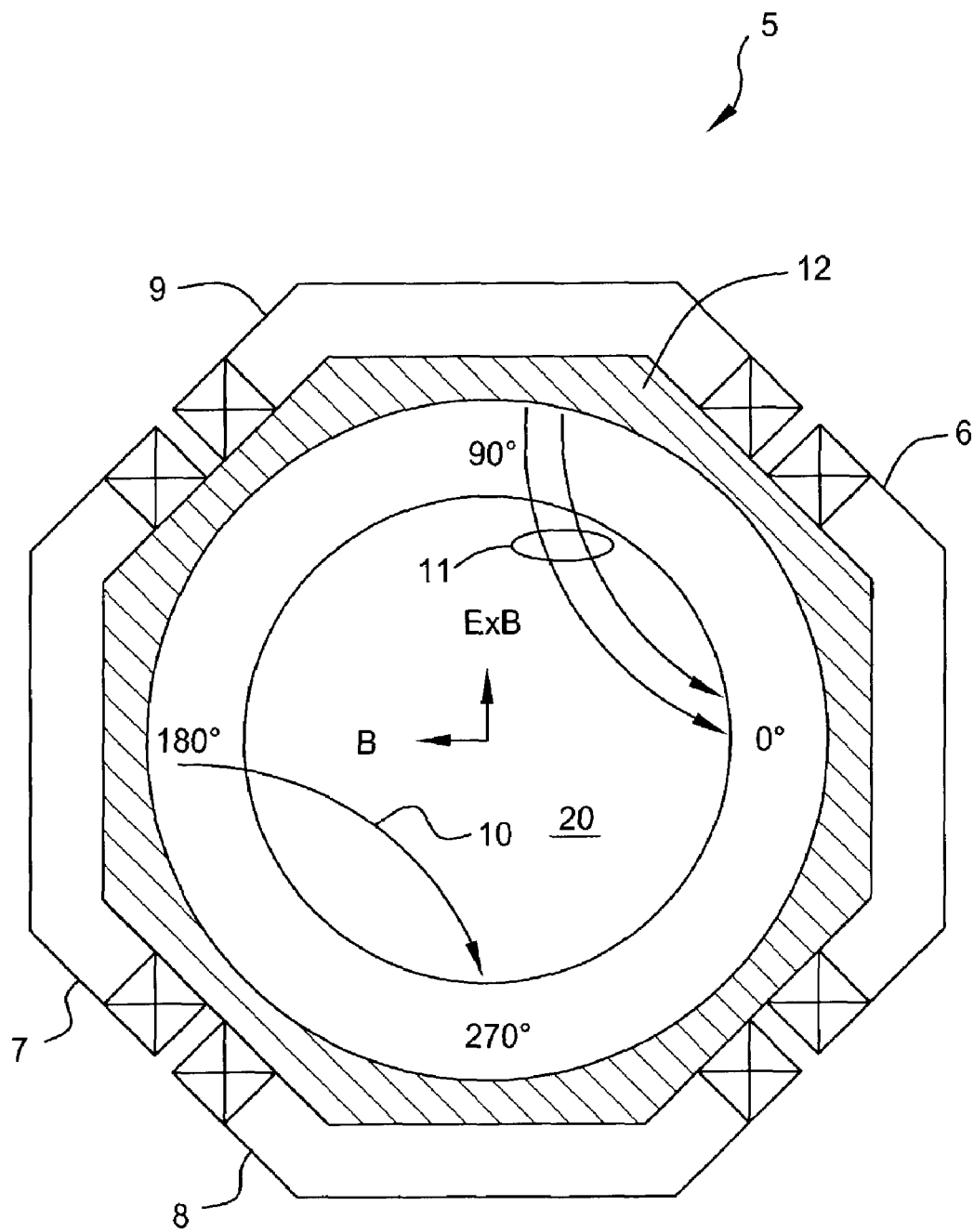
FIG. 2 depicts a schematic, top cross sectional view of the magnetically enhanced plasma chamber of FIG. 1.
Figure 3:
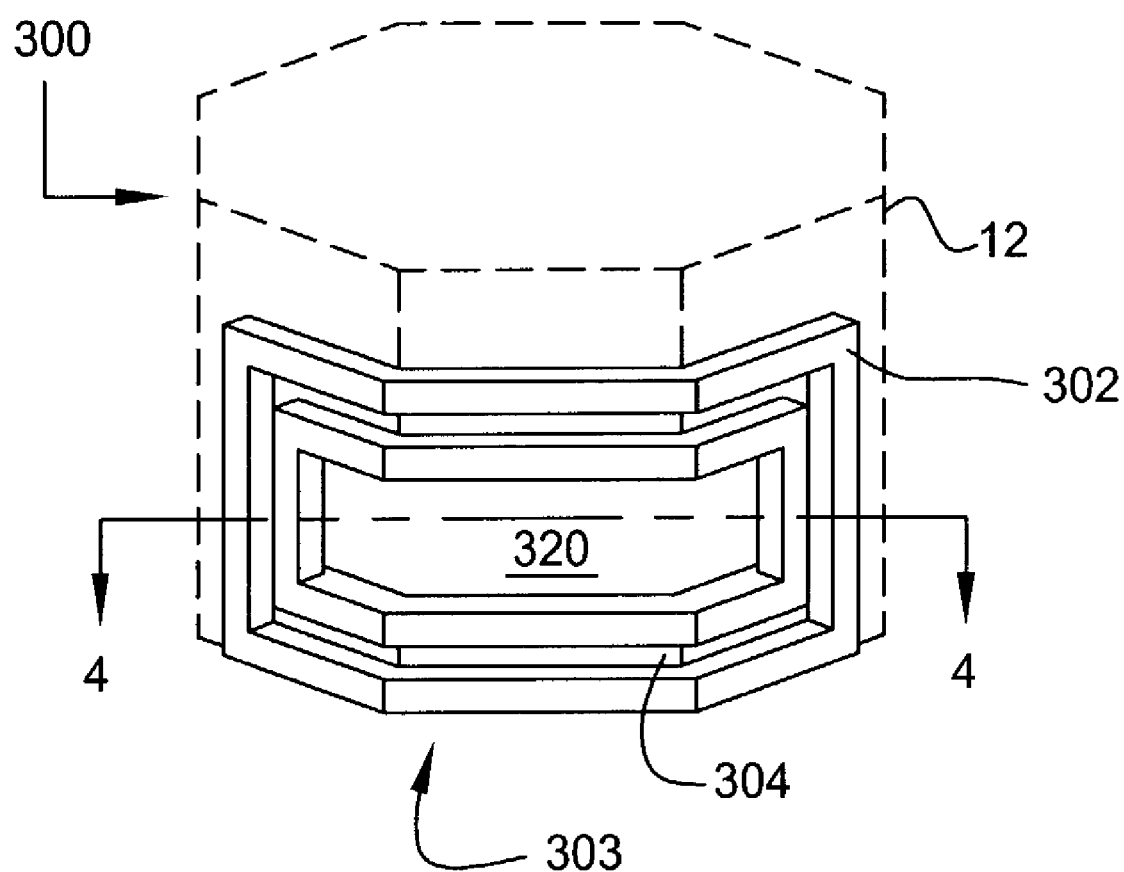
FIG. 3 depicts a perspective view of a coil and counter coil combination of one embodiment of the invention.
Figure 4:
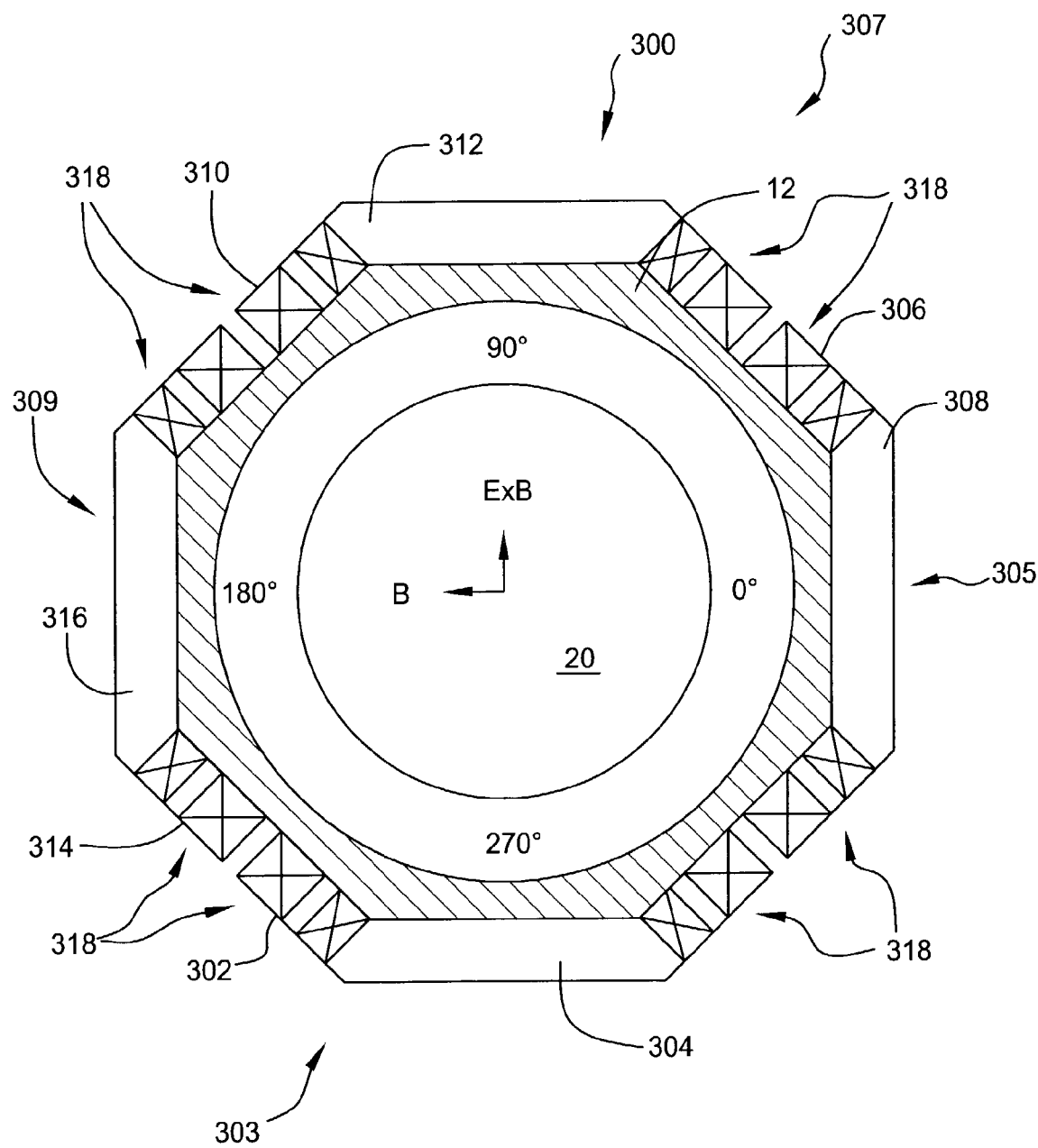
FIG. 4 depicts a schematic top view of a magnetically enhanced plasma chamber in accordance with the first embodiment of the invention.

A first embodiment of the invention is depicted in FIGS. 3 and 4. FIG. 3 depicts a perspective view of a coil pair 303 comprising a first coil 302 and a second coil, known as a counter coil 304, wherein the counter coil 304 is positioned concentric with and inside the main coil 302. The coil pair 303 is positioned proximate a chamber side wall 12 (shown in phantom in FIG. 3). FIG. 4 depicts a schematic, cross-sectional top view of a plasma reactor 300 comprising the coil pairs 303, 305, 307 and 309 of one embodiment of the present invention. The main coils 302, 306, 310, and 314 have a size, position and generally operate in the same manner as the prior art coils 30 and 32 of FIGS. 1 and 2. The counter coils 304, 308, 312, and 316 are dimensioned slightly smaller than the main coils 302, 306, 310 and 314 and fit inside the central opening 320 (see FIG. 3) in the main coils. The main and counter coils in each coil pair 303, 305, 307 and 309 are concentric and substantially coplanar with one another. Each coil has a pair of pole ends 318 that are bent inward to conform the coil to the octagonal shape of the sidewall 12. These pole ends 318 when bent inward are referred to as "ears".

Figure 17:
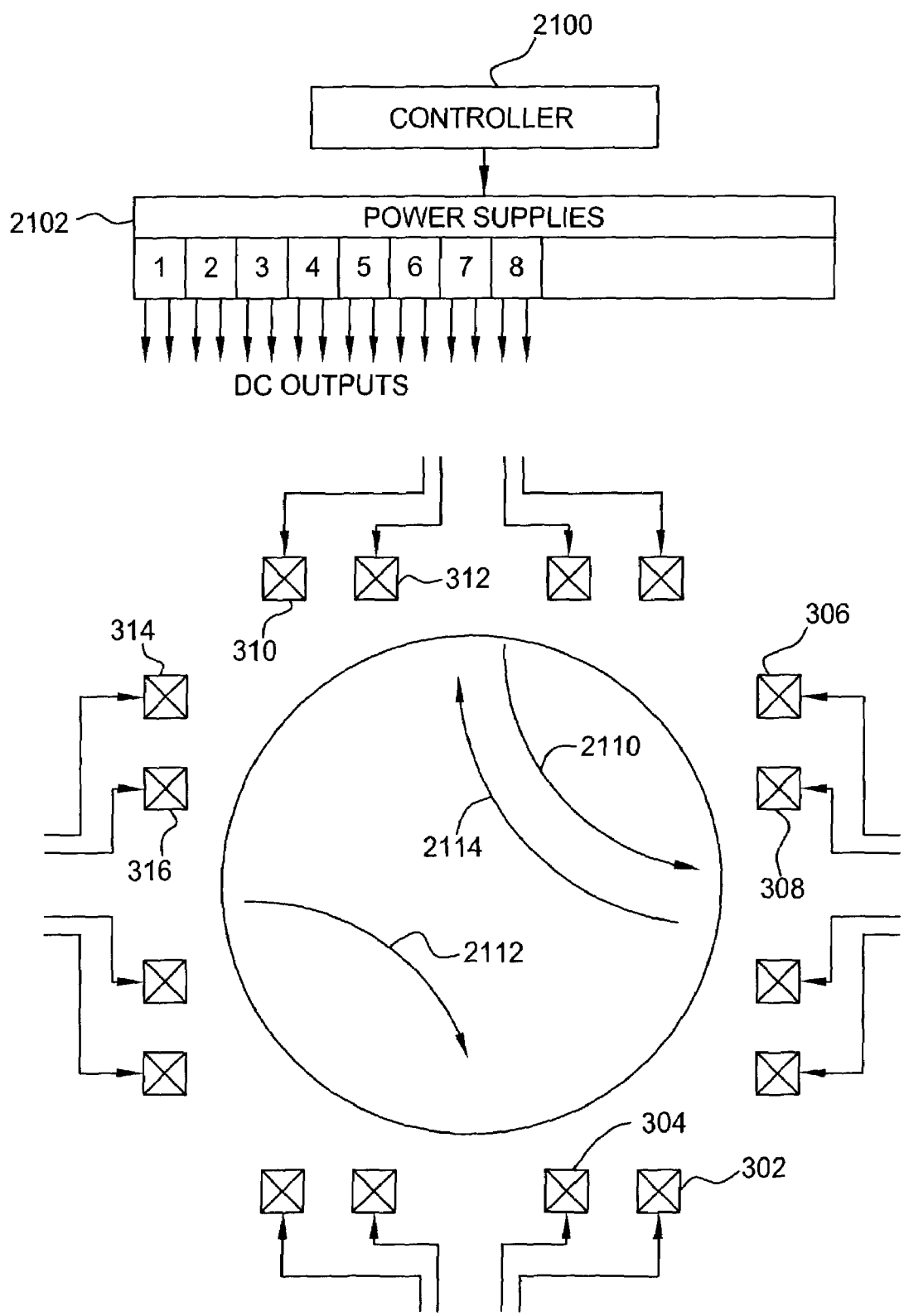
FIG. 17 depicts a block diagram of the electronics used to drive the magnetic coils of the invention depicted in FIGS. 3-6.

FIG. 17 depicts a block diagram of the electrical circuitry for powering the coil pairs 303, 305, 307 and 309 of the present invention. Each coil is associated with a separate and independent power supply such that each coil can be independently driven with current. Such an arrangement provides the maximum flexibility in producing magnetic fields within the reactor. However, in certain applications, fewer power supplies than one per coil may be used and some of the currents may be coupled to a plurality of coils simultaneously.

A controller 2100 is utilized to control the current that is applied to the electromagnets by the array 2102 of power supplies (numbers 1-8). Such current control regulates the magnitude and direction (polarity) of the current supplied to the electromagnets. The magnitude of the magnetic field is generated by the electromagnets and the resultant magnetic field vector formed by the combined magnetic field is generated by each of the electromagnets. Specifically, the electromagnetic coils are arranged as pairs of coils on either side of the reactor. Physically, coil pairs 303 and 307 are aligned with one another along a first axis, and coil pairs 305 and 309 are aligned with one another along a second axis. The first and second axes are orthogonal to one another.

In one embodiment of the invention, each coil 302 through 316 as separately connected to an independently controllable DC power supply 1-8 in the power supply array 2102. The controller 2100 controls the current magnitude generated by each power supply and the timing of when the current is applied to the coils.

The current driven through the counter coils 304, 308, 312, and 316 is always directed in an opposite direction of the current that is being driven through the main coil associated with a particular counter coil. As such, the magnetic field (B-field) vector is oppositely directed for the counter coil with respect to the B-field generated by the main coil. In a static application of current (non-rotating B-field), adjacent main coils 302 and 306 are driven with current to produce a high B-field (represented by bold arrow 2110), and the opposing main coils 310 and 314 are driven with current to produce a low B-field (represented by arrow 2112). In the prior art CMF reactor, main coils 302 and 306 are driven with +4 and −4 amps, respectively, and main coils 310 and 314 are driven with −1 and +1 amps, respectively. The imbalance in drive current values, representing a CMF ratio of 0.25, forms a B-field having a gradient. These four current values are switched from one coil to another in a time progression to cause the magnetic field to rotate. A full disclosure of the operation of a CMF reactor is provided in the '731 patent cited above.

The adjacent counter coils 308 and 312 produce a magnetic field that is oppositely directed to the magnetic field produced by the main coils 306 and 310. The counter coil field is represented by arrow 2114. The counter coils produce a magnetic field that is intended to suppress the high B-field 2110 produced near the edge of the wafer 20. By adjusting the current in the counter coils, the magnitude of the B-field near the high current coils can be controlled in a manner heretofore thought impossible.

Figure 5:
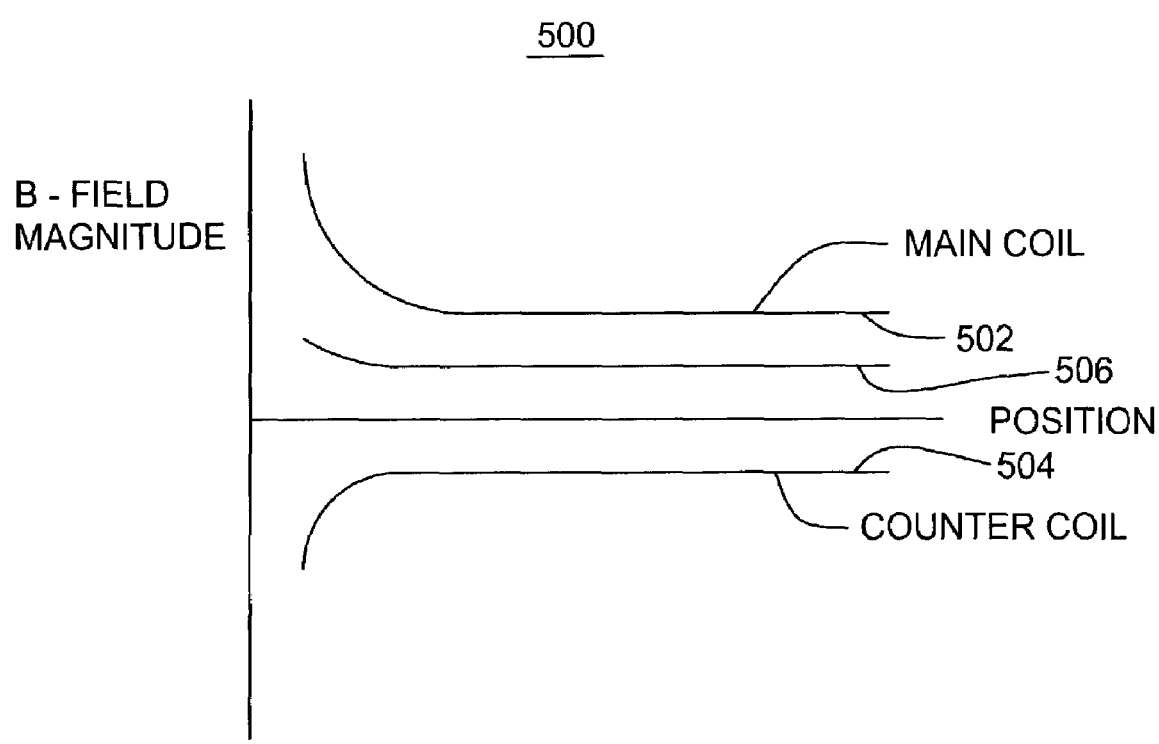
FIG. 5 depicts a graph of the magnetic field contributions of the main coil and the counter coil to the magnetic field that appears within the chamber.

FIG. 5 depicts a graph 500 of the relative strengths of the B-fields generated by the main coils 306 and 310 (graph 502) and the counter coils 308 and 312 (graph 504). The superposition of the two B-field magnitudes 502 and 504 generated by the main coil and the counter coil is represented by line 506. Depending on the current selection, the B-field magnitude near the coil pairs 305 and 307 is suppressed such that the superposed B-field may be more uniform across the entire width of the chamber. This uniformity is dependent upon the relative ratios of the currents driven into the counter coil and main coil. Modeling of the embodiment of the invention has shown that, to obtain a substantially uniform magnetic field as produced by one coil pair, the B-field strength at the center of the wafer as produced by the counter coil should be about 70% of the B-field strength at the center of the wafer as produced by the main coil. Thus, the resultant, combined B-field strength, while both coils are operating, would be about 30% of the B-field strength of the main coil by itself. The magnitude of the counter coil current provides substantial control over the B-field magnitude near the edge of the wafer. As such, the field gradient needed to control the ExB drift can be accurately controlled through adjusting the main and counter coil currents.

Figure 6:
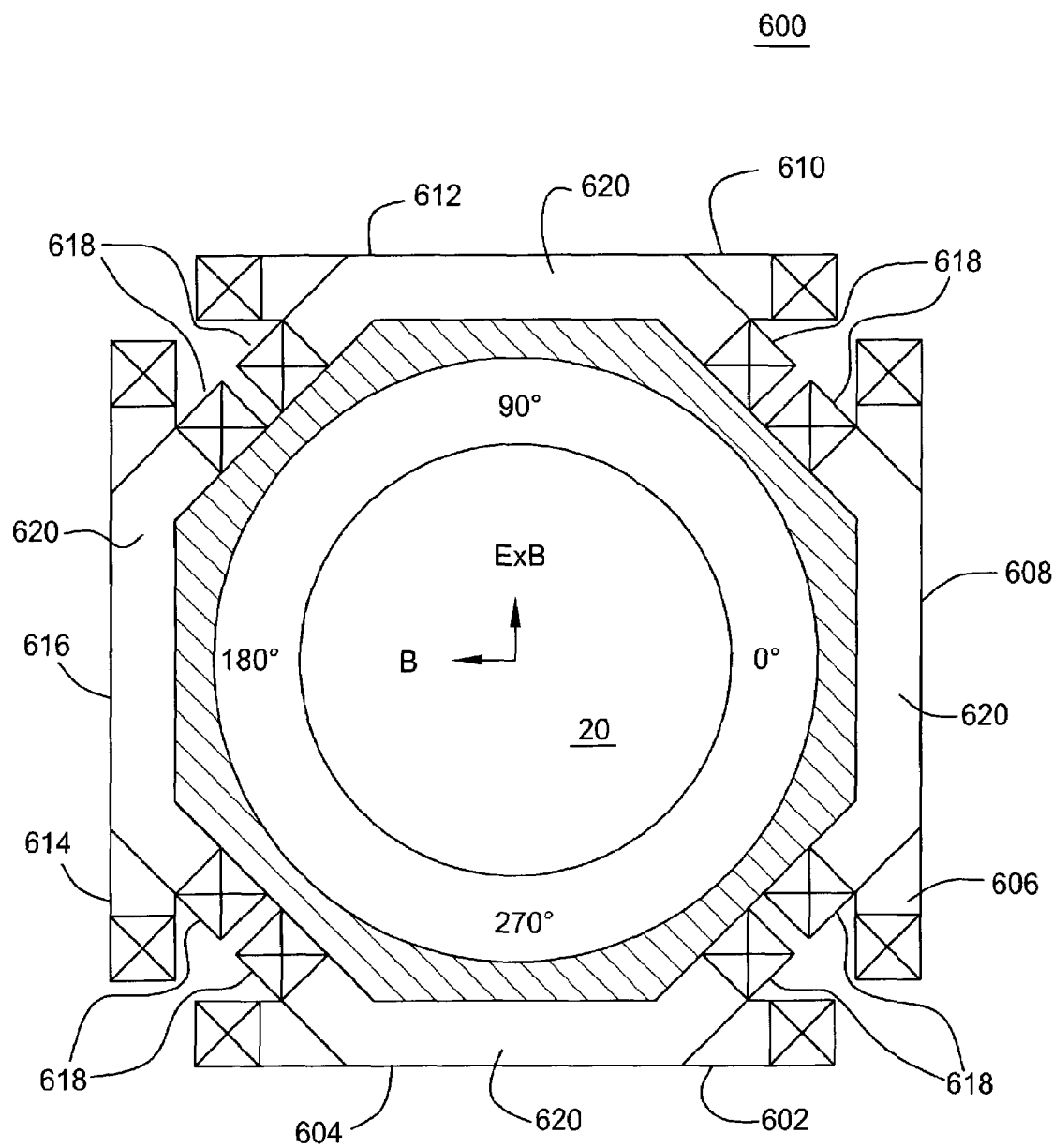
FIG. 6 depicts a schematic top view of another embodiment of the invention that uses a counter coil.

FIG. 6 depicts a second embodiment of the invention wherein the main coils 602, 606, 610 and 614 are substantially flat, while the counter coils 604, 608, 612 and 616 conform to the side wall 12 of the chamber by having "ears" 618 on the pole ends of the electromagnetic counter coils. In the previous embodiment, both the main coils and the counter coils had ears to circumscribe the chamber wall. In this embodiment, the main coils 602, 606, 610 and 614 have an approximate dimension of 560 mm in length and 360 mm in height, while the counter coils 604, 608, 612 and 616 have a length of 520 mm and a height of 360 mm. The ears 618 on the counter coils 604, 608, 612, and 616 bend inward from the main portion 620 of each counter coil by approximately 30 mm. As such, the inner portion (main portion 620) of the counter coils is 460 mm in length. The ears 618 are bent inward at a 45° angle relative to the main portion 620 of each of the counter coils. In this embodiment, each counter coil has 283 turns of #14 gauge copper wire while each main coil has 396 turns of #14 gauge copper wire The electrical connections of FIG. 17 are used to power the coils of the embodiment of FIG. 6. The magnetic structure of FIG. 6 can be incorporated into an etch chamber for etching dielectric materials. If the magnetic field is electrically rotated by sequentially switching the polarity of the coils in a manner described above with reference to FIG. 17, the uniformity of an etch process can be reduced to approximately 2% across the wafer. The uniformity is measured as the maximum minus minimum deviation of the etched thickness of a dielectric film on the wafer taken at a plurality (e.g., 49) of measurement points on the wafer. By only powering the main coils and rotating the magnetic field, while adjusting the relative current values to maintain the same B-field strength at the center of the wafer, the etch uniformity result is more than doubled to approximately 4.1%. For stationary magnetic fields using only the main coils, the uniformity is approximately 19%, while using the counter coils will improve the uniformity derived from stationary magnetic fields to approximately 14%. Consequently, substantial improvement can be seen when using the counter coil embodiment of the invention. In addition, Gauss meter measurements across the wafer show that the use of counter coils substantially flattens the B-field gradients across the wafer such that the B-field is more uniform when using the counter coils than when not.

Further, E/C ratio improvement can be produced by increasing the height of the main coils, while maintaining the height of the counter coils.

2. Shunt Ring

Figure 7:
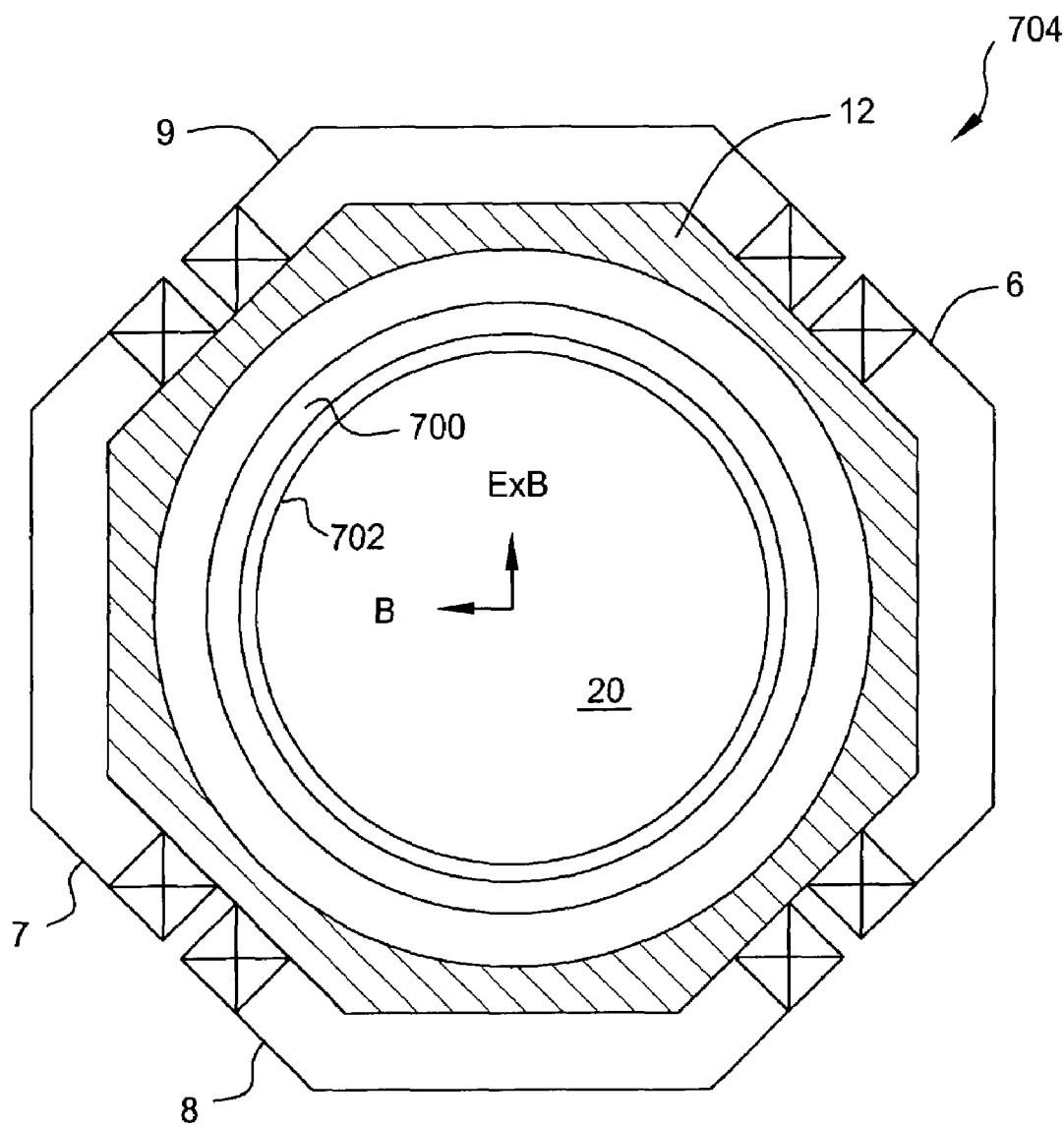
FIG. 7 depicts a schematic top view of another embodiment of the invention having a magnetic shunt ring circumscribing the wafer support.

Another embodiment of the invention that provides a more uniform plasma within a magnetically enhanced plasma reactor is depicted in FIGS. 7 through 11. The invention incorporates a shunt ring 700 into a chamber 704 proximate the edge 702 of the wafer 20. The shunt ring 702 interacts with the magnetic fields produced by the coils 6, 7, 8 and 9. The shunt ring is fabricated of a magnetic material, for example, nickel or steel. The material properties such as permeability, saturation and the like affect the effectiveness of the shunt rung in suppressing the magnetic field proximate the wafer 20. FIG. 7 depicts a schematic, top view of a chamber incorporating the shunt ring 700 within the chamber 704. The shunt ring 700 circumscribes the wafer 20. The shunt ring 700 interacts with the magnetic field near the edge of the wafer to slightly suppress the field strength thereof. In the embodiment shown, the magnetic structures (coils 6, 7, 8 and 9) used to supply the magnetically enhanced B-field are those of the prior art. The counter coil structures of the first and second embodiments of the invention could be used in addition to the shunt ring to further control the B-field gradient.

In general, the nearer the shunt ring is positioned to the wafer edge 702, the greater the B-field suppression. Additionally, the amount of shunt material in the shunt ring, i.e., the size of the cross-section of the ring, also controls the amount of B-field suppression. The more material in the ring, the greater the shunting effect. The shunt ring is generally oriented symmetrically along the wafer axis and near the plane of the wafer. Such orientation ensures that a z-component is not introduced by the shunt ring into the B-field above the wafer. A z-component in the B-field may be detrimental to achieving a uniform plasma above the wafer.

Figure 8:
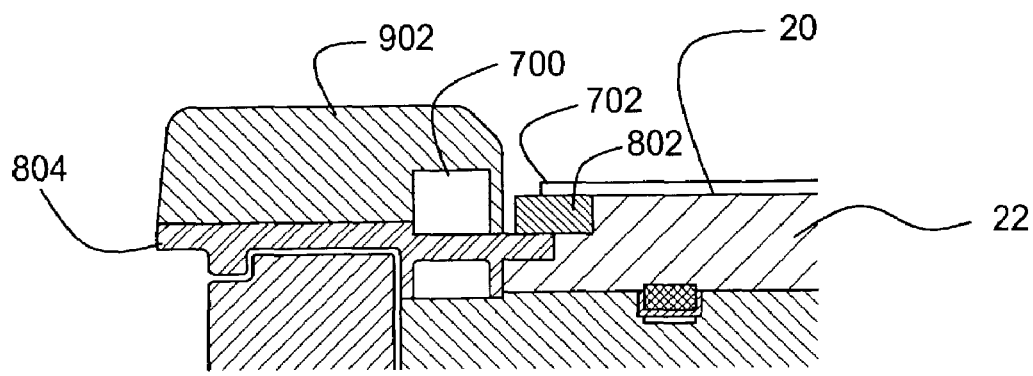
FIGS. 8, 9 and 10 depict cross-sectional views of a portion of various wafer supports containing a magnetic shunt ring of FIG. 7 in accordance with additional embodiments of the invention.

FIG. 8 depicts a detailed cross-sectional view of an edge portion 800 of the cathode pedestal 22 and edge ring 72 of the chamber 5 of FIG. 1. FIG. 8 depicts a cathode pedestal 22, a silicon ring 802, and an edge ring 72. The edge ring 72 is formed of two components: a top edge ring 902 and a bottom edge ring 804. The top edge ring 902 sits atop a bottom edge ring 804. During processing, the wafer rests upon the cathode pedestal 22 and overhangs the silicon ring 802. The edge ring 72 is generally fabricated of a dielectric material such as quartz and protects the components of the cathode pedestal 22 from the etchant gases. The edge ring also controls the amount of RF coupling that is achieved through the ring 72. The thickness of the edge ring and its material regulate the RF coupling from the pedestal to the plasma such that the plasma sheath can be expanded to cover the entire surface of the wafer 20. The cathode pedestal 22 may comprise some form of wafer retention device such as an electrostatic chuck or vacuum chuck for holding the wafer 20 in a stationary, horizontal orientation.

The silicon ring 802 is provided beneath the edge of the wafer 20 and covers a portion of the bottom edge ring 804. The silicon ring 802 protects the bottom edge ring 902 from erosion by the plasma used in a dielectric (e.g., silicon dioxide) etch process.

The shunt ring 700 is positioned atop the bottom edge ring 804 and is encapsulated by the top edge ring 902. The ring 700 is located proximate the silicon ring 802 but does not contact the edge 702 of the wafer 20. The cross-section of the shunt ring 700 in the embodiment of FIG. 8 is substantially square. The use of the shunt ring 700 suppresses the etch rate proximate the edge 702 of the wafer 20 by reducing the magnitude of the magnetic field at the edge of the wafer. The use of the shunt ring 700, being fabricated of a magnetic material such as steel or nickel, can suppress the B-field at the wafer edge 702 by as much as 50%.

Figure 9:
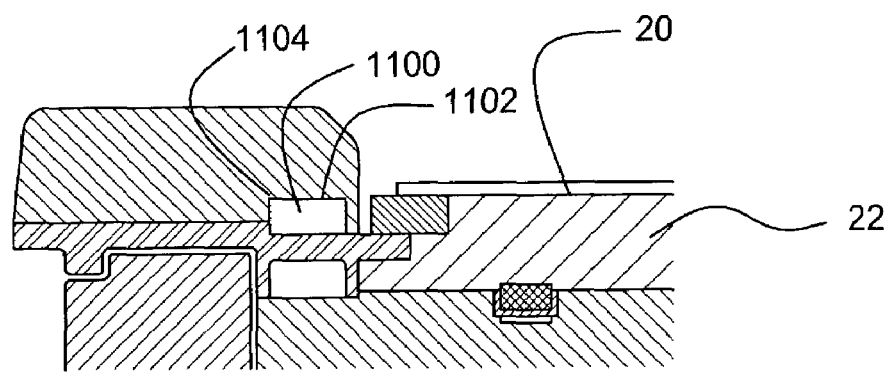

In another embodiment of the shunt ring invention, in FIG. 9 depicts a shunt ring 1100 having a width 1102 that is greater than the height 1104. The width 1102 of the shunt ring 1100 is approximately 1.25 cm and the height 1104 of the shunt ring 1100 is approximately 1 cm. The height or thickness of the shunt has a direct impact on the amount of suppression of the B-field near the edge of the wafer.

Figure 10:
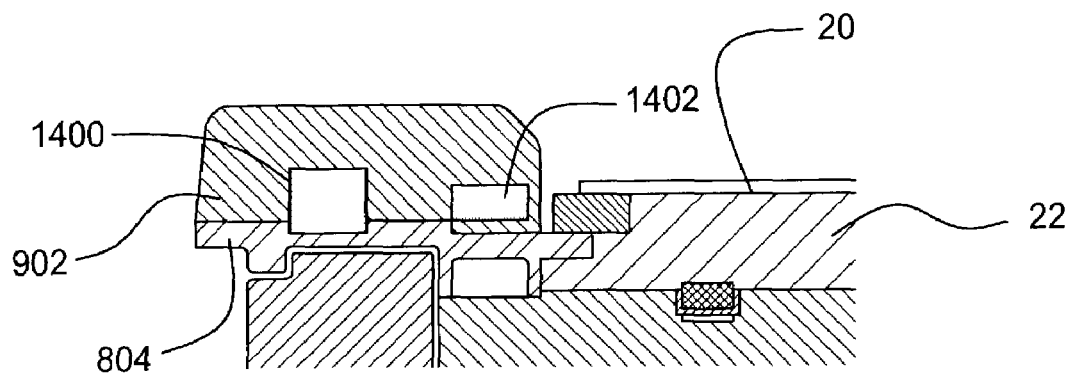

FIG. 10 depicts the use of a pair of shunt rings 1400 and 1402 being positioned substantially co-planar with the wafer 20 and having one shunt ring 1402 closer to the wafer 20 than the second shunt ring 1400. Positioning and sizing the shunt rings 1400 and 1402 can be used to optimize the B-field suppression and the B-field gradient.

3. Shield Within the Magnetic Coils

In another embodiment of the invention, the B-field near the center of the wafer is enhanced using a shield within the center of each magnetic coil. The shield may be a solid plate that substantially fills the space within a coil, a pair of vertical bars, a pair of horizontal bars, or a "picture frame"0 formed of a plurality of bars. The components of the shield are fabricated of a magnetic material such as steel, iron, nickel and the like. When energized, the magnetic field from each coil is coupled to the shield and thereby magnetizes the shield. The magnetized shield enhances the B-field near the center of the wafer. This shield structure can be used with any of the embodiments of the invention described in this disclosure.

Figure 11:
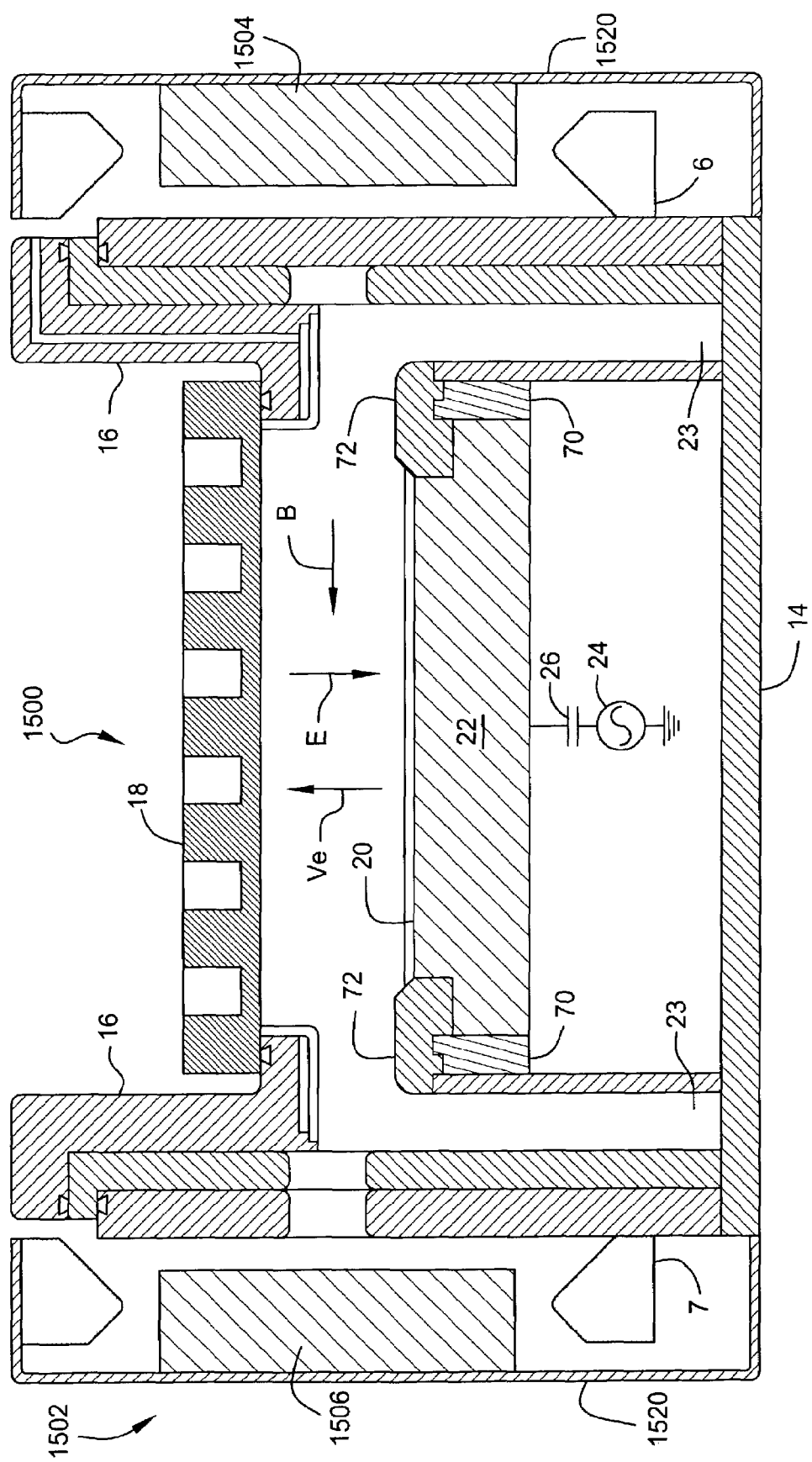
FIG. 11 depicts a schematic longitudinal sectional view of a magnetically enhanced plasma chamber in accordance with another embodiment of the invention having a metal plate inserted in the magnetic coil.
Figure 12:
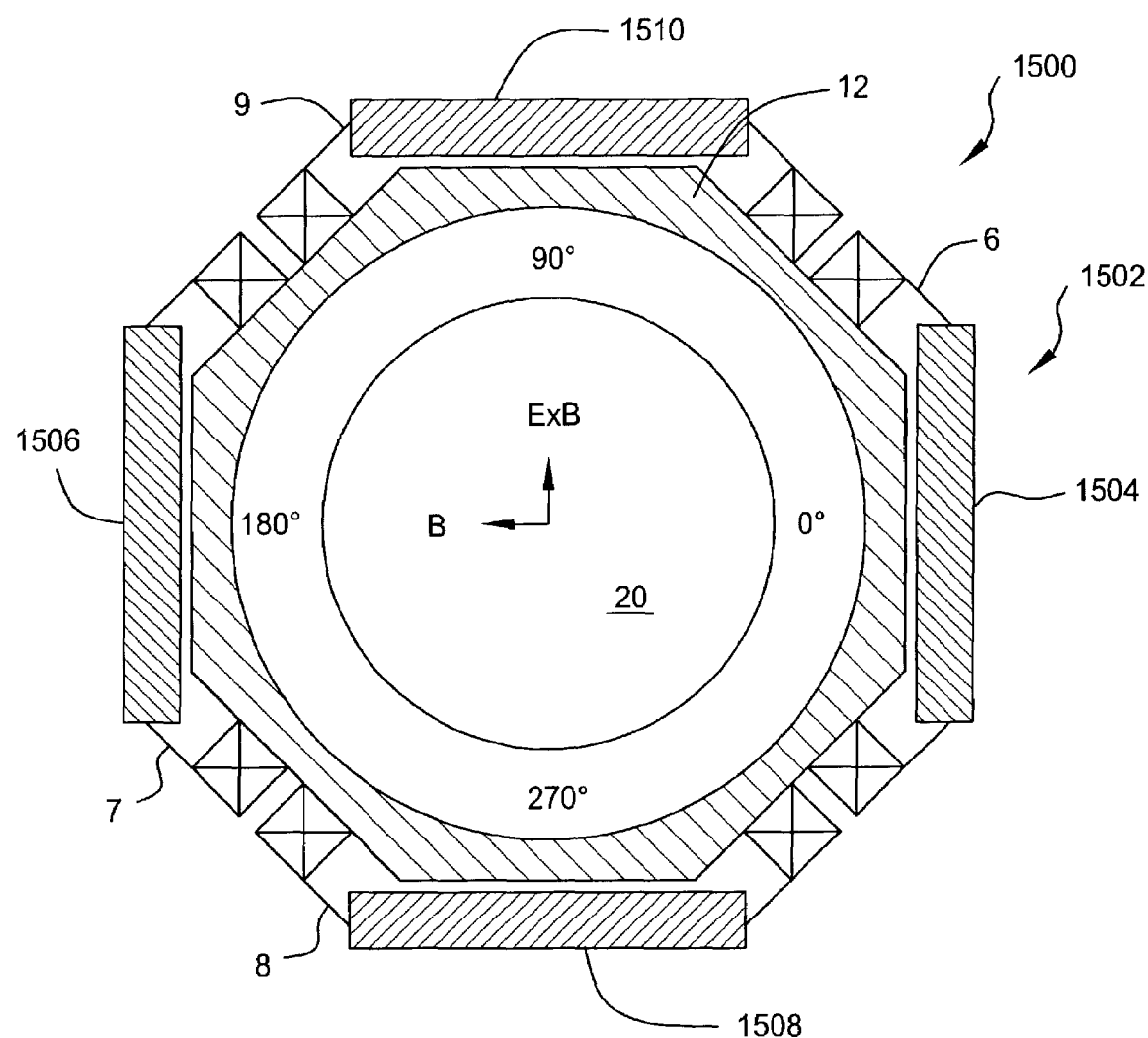
FIG. 12 depicts a schematic top view of the magnetically enhanced plasma chamber of FIG. 11.

FIG. 11 depicts a cross section of a reactor 1500 comprising a shield 1506 positioned within the coils 30 of a reactor 1500. FIG. 12 depicts a top, cross-sectional view of the reactor 1500. In this particular embodiment, the shield 1502 comprises a plate 1504, 1506, 1508, and 1510 within each of the coils 6, 7, 8 and 9. Each plate 1504, 1506, 1508, and 1510 is circumscribed by the turns of coils 6, 7, 8 and 9. The plate 1504, 1506, 1508, and 1510 lies in the plane of the associated coils 6, 7, 8 and 9 such that, when energized with a current, the magnetic field produced by the coils penetrates and magnetizes the plates 1504, 1506, 1508, and 1510. The plates 1504, 1506, 1508 and 1510 are generally affixed to the chamber walls 1520.

One specific embodiment of the magnetic field control element formed of shields 1504, 1506, 1508 and 1510 may increase the magnitude of the B-field at the center of the wafer by as much as 50% comprises a plate that is 35.56 cm wide, 20.32 cm high and is 6.35 cm thick and is fabricated from 1010 steel. The B-field increase is measured with respect to a B-field generated near the center of the wafer using a prior art apparatus such as that discussed with respect to FIGS. 1 and 2.

Figure 13:
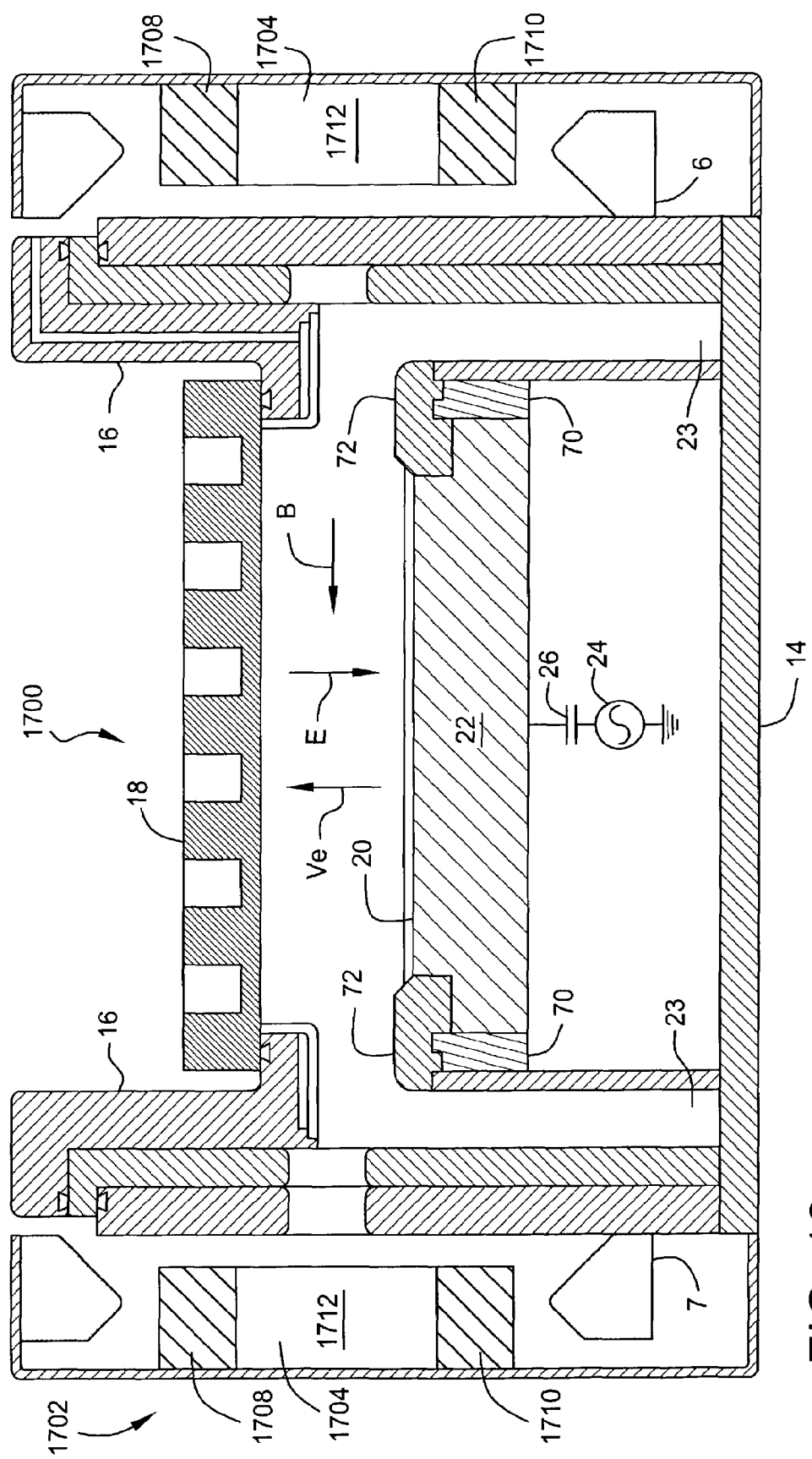
FIG. 13 depicts a schematic longitudinal sectional view of a magnetically enhanced plasma chamber in accordance with another embodiment of the invention having a metal ring inserted in the magnetic coils.
Figure 14:
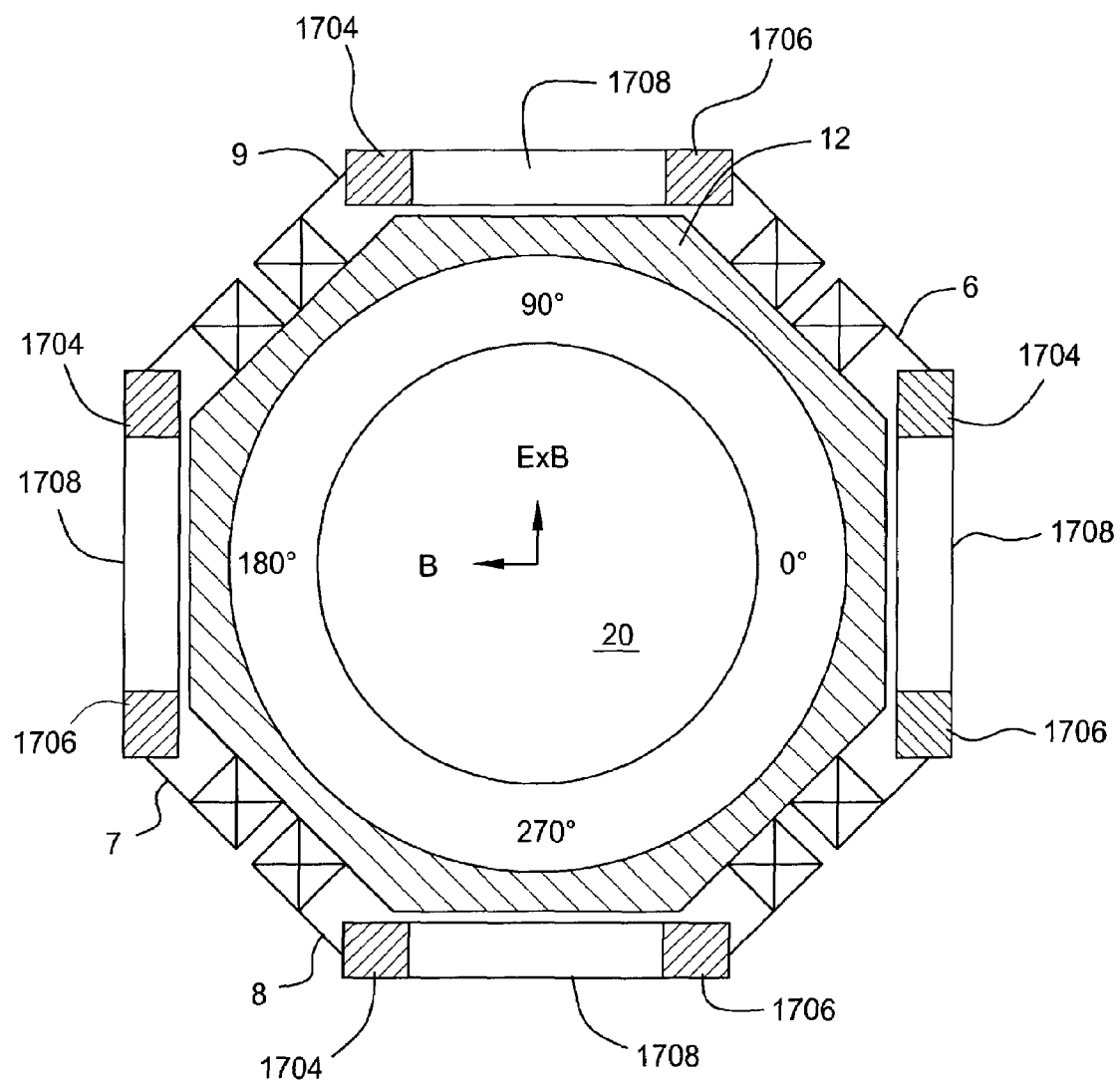
FIG. 14 depicts a schematic top view of a magnetically enhanced plasma chamber of FIG. 13.

A second embodiment of the inventive shield is depicted in FIGS. 13 and 14. FIG. 13 depicts a vertical cross section of a reactor 1700 having a rectangular ring shield 1702 positioned within each coil 6, 7, 8 and 9. FIG. 14 depicts a horizontal cross section of the reactor 1700 of FIG. 13. The rectangular ring shield 1702 is, in essence, the plate of the embodiment of FIGS. 11 and 12 having a center portion removed. As such, the shield 1702 is shaped like a rectangular "picture frame" having an opening 1712 defined by two vertical bars 1704 and 1706 and two horizontal bars 1708 and 1710, where each end of a vertical bar 1704, 1706 is connected to a respective end of a horizontal bar 1708, 1710. Each ring shield 1702 is positioned within the plane of each coil in the same manner that the plates are positioned in the embodiment of FIGS. 11 and 12. With such an opening in the shield, a conventional robot can be used to supply and remove the wafer from the chamber through the chamber wall.

In one specific embodiment of the invention, the rectangular shield 1702 is milled from a plate of 1010 steel with outer dimensions of 35.56 cm wide, 20.32 cm high and is 6.35 cm thick and a uniform bar width of approximately 5 cm. Upon the coils being energized, each ring shield 1702 operates like a magnetic core and enhances the B-field near the center of the wafer. The B-field at the center of the wafer is estimated to increase by as much as 50%.

In another embodiment of the shield, the shield may contain only a pair of vertical or horizontal bars, i.e., bars 1704 and 1706 or 1708 and 1710. The vertical bar pairs 1704 and 1706 are positioned within the coil plane and near the vertical pole portions of the coils. Similarly, the horizontal bars 1708 and 1710 are positioned near the bar portion of each of the coils. If counter coils are used, the bars 1704, 1706 or 1708, 1710 may be positioned between the main coil and the counter coil.

In one specific embodiment using horizontal bars, each of the bars had a dimension of approximately 15.56 cm long, 2.5 cm high and 6.35 cm thick and was fabricated of 1010 steel. The use of such horizontal bars has been estimated to increase the B-field at the wafer center by as much as 34%. When the bars are fabricated of iron, the B-field is estimated to increase by as much as 36%. In another specific embodiment using vertical bars, each of the bars had a dimension of approximately 20.32 cm long, 2.5 cm wide and 6.35 cm thick. The use of such vertical bars has been estimated to increase the B-field at the wafer center by as much as 12%.

In further embodiments of the invention, the shields may be asymmetrical having a shield plate in two opposing coils and bars in to other opposing coils. Such combinations may extend to including the shunt ring of FIG. 7 through 10 or the counter coils of FIGS. 4 and 6.

4. Side Coil Pairs

Figure 15:
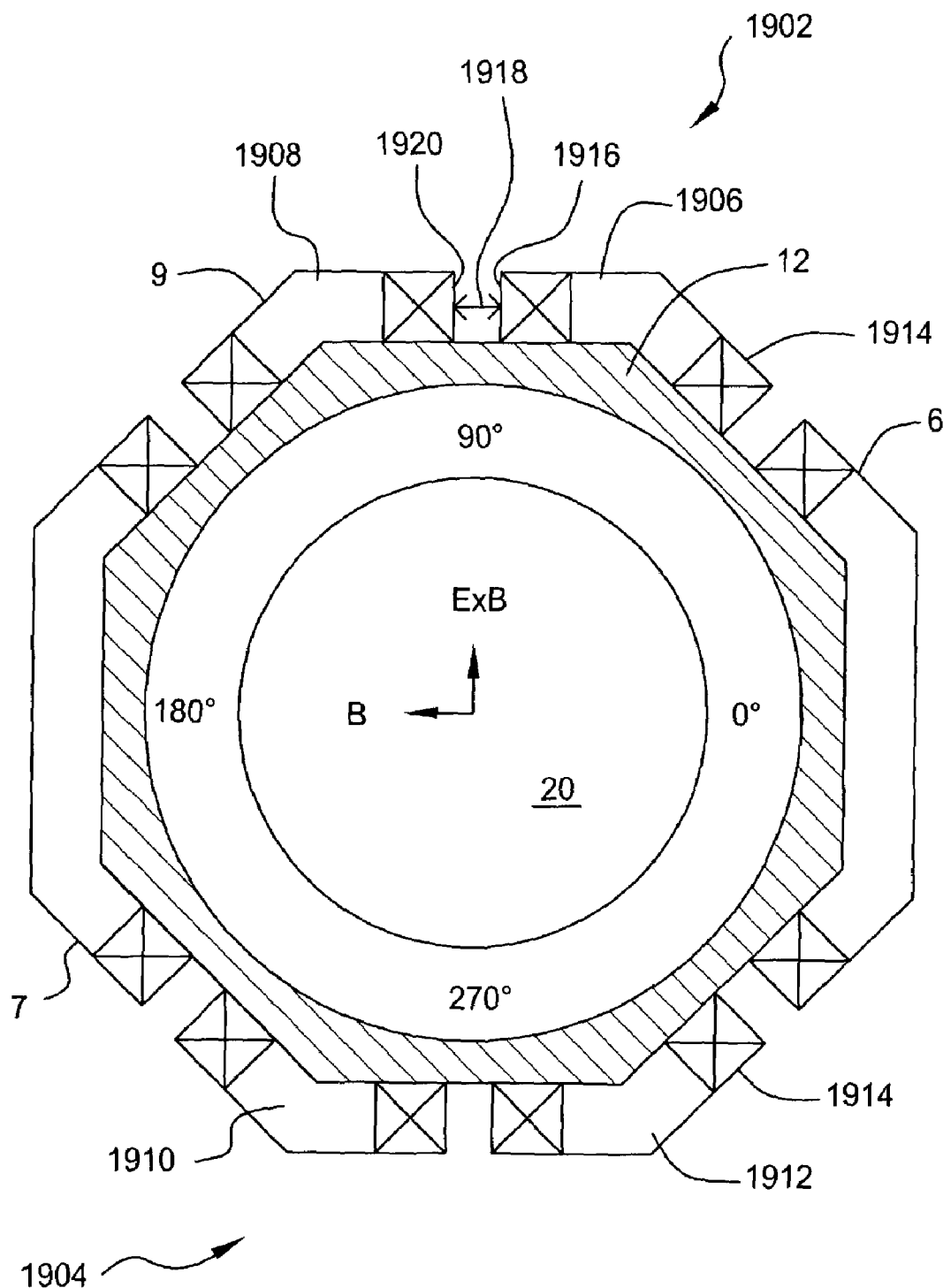
FIG. 15 depicts a schematic top view of a magnetically enhanced plasma chamber of another embodiment of the invention having a coil pair being sectioned into two coils.

In another embodiment of the invention, one pair of opposing coils 7, 9 of the prior art reactor of FIGS. 1 and 2 are replaced with coil pairs as shown in the FIG. 15. FIG. 15 depicts a schematic top, cross-sectional view of a reactor 1900 having opposing coil pairs 1902 and 1904 and opposing coils 6, 8. Each coil pair 1902 and 1904 comprises a first coil 1906, 1908 and a second coil 1910 and 1912. Each of the coils 1906, 1908, 1910, and 1912 comprises an ear 1914 at the pole portion in the same manner as the ears are provided on the prior art magnetic coils. An inner end 1916 of each side coil 1906, 1908, 1910, and 1912 is spaced a distance 1918 (referred to as the side coil gap) from an adjacent inner end 1920 of coil 1908. The spacing may vary from approximately 1.25 cm to 7.5 cm. Coiled pair 1904 is similarly constructed and gapped.

The size of the coil gap 1918 has been shown to control the gradient of the B-field across the wafer. As a larger gap 1918 is used, the B-field gradient is flattened. When uneven currents are coupled to the coils, e.g., main coils 6, 8 at +/−500 amps, side coils 1908 and 1910 at +/−1000 amps and opposing side coils 1906 and 1912 at +/−500 amps, the B-field at the top and bottom of the wafer is decreased. The coils are energized in adjacent pairs.

5. Increased Number of Coils

Figure 16:
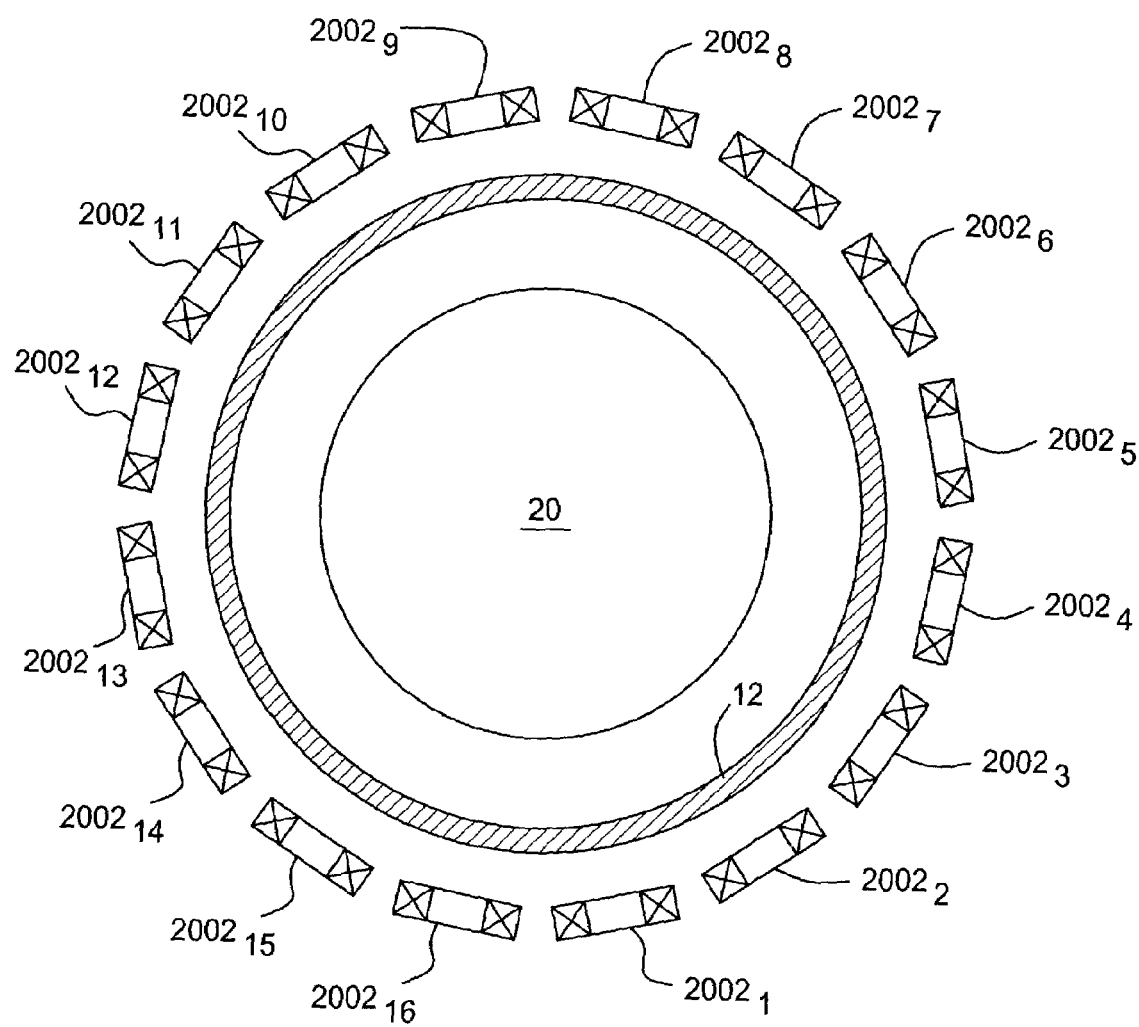
FIG. 16 depicts a schematic top view of yet another magnetically enhanced plasma chamber in accordance with another embodiment of the invention having a plurality of coil pairs positioned about the chamber.

In another embodiment of the invention, the number of magnetic coils is increased to utilize between 6 and 16 coils. FIG. 16 depicts a schematic, top cross-sectional view of a reactor 2000 comprising a plurality of coils $2002_n$, where n is an integer ranging from 6 to 16. The number of coils may be even or odd; however, an even number provides a more symmetric magnetic field. The coils may be driven statically or in a sequential manner to rotate the magnetic field relative to the wafer. When using 16 coils, the magnetic field can be rotated in 22.5 degree increments. This enables improved plasma control such that the plasma does not rotate in large discreet steps. Such an arrangement enables the B-field gradient to be contoured using the N coils. As such, pairs of coils may be driven to form B-fields that suppress a B-field produced by a neighboring pair of coils. These coils form a magnetic field control element in accordance with the present invention.

6. Corner Shields

Figure 18:
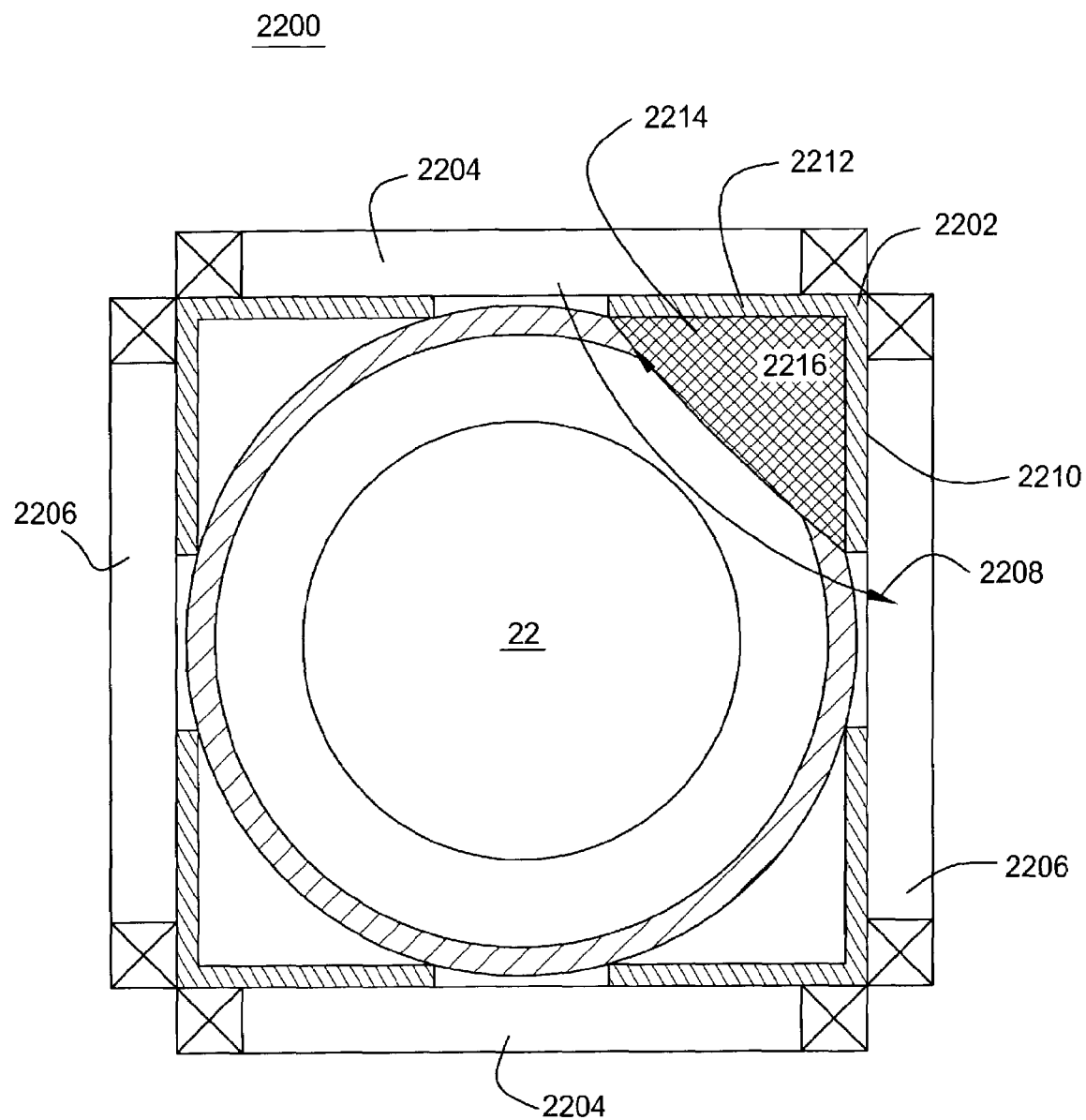
FIG. 18 depicts a schematic top view of another embodiment of the invention having corner shields positioned between adjacent coils of a magnetically enhanced plasma chamber.

FIG. 18 depicts a top, cross sectional view of a plasma chamber 2200 containing another embodiment of the invention. The invention comprises a plurality of corner shields 2202 that form a magnetic field control element that is positioned at the corners where adjacent coils 2204, 2206 are proximate one another. The corner shields 2202 are elongate members having a length that is approximately equivalent to the height of the coils 2204, 2206 and having an angled cross section. Each shield 2202 comprises two sides 2210 and 2212 that are affixed to one another to form an angle. The angle may be a right angle, but may be any other angle. The hatched area 2216 between the sides 2210 and 2212 defines a region in which the B-field produced by coils 2204 and 2206 is suppressed. The sides 2210 and 2212 of the shields 2202 are located proximate the coils 2204, 2206 such that a magnetic field from the coils (represented as arrows 2208) couples into the shield 2202. The shield 2202 then radiates a magnetic field (represented by arrow 2214) between the ends of each of the sides 2210, 2212. This radiated magnetic field is oriented in an opposite direction to the direction of the magnetic field produced by the main coils 2204, 2206. This secondary magnetic field suppresses the magnetic field produced by the main coils in the corners of the chamber, thus improving the edge-to-center B-field ratio. The higher the saturation level of the material used in the shield the better the field suppression effect. Such materials include ultra-low carbon steel, mu-metal, iron, nickel, and the like.

Another way to look at the magnetic field suppression effect of the corner shields is that each shield shunts some of the magnetic field produced by neighboring coils (e.g., shield 2202 shunts a portion of the field from coils 2204 and 2206). The field shunting suppresses the field with in the area 2216 between the shield sides 2210 and 2212.

To efficiently couple the main coil magnetic field into the corner shields 1202, the shields should abut the coils, or be positioned very close to the coils. In one embodiment the shields are fabricated of 1.25 cm thick steel with the sides being 10 cm in length and the shields being as tall as the coil height. Using such shields with a CMF ratio of 0.333, the B-field strength at the high-magnitude edge of the wafer is expected to be lowered by approximately 10% while maintaining the same B-field strength at the center of the wafer.

7. Center Shields

Figure 19:
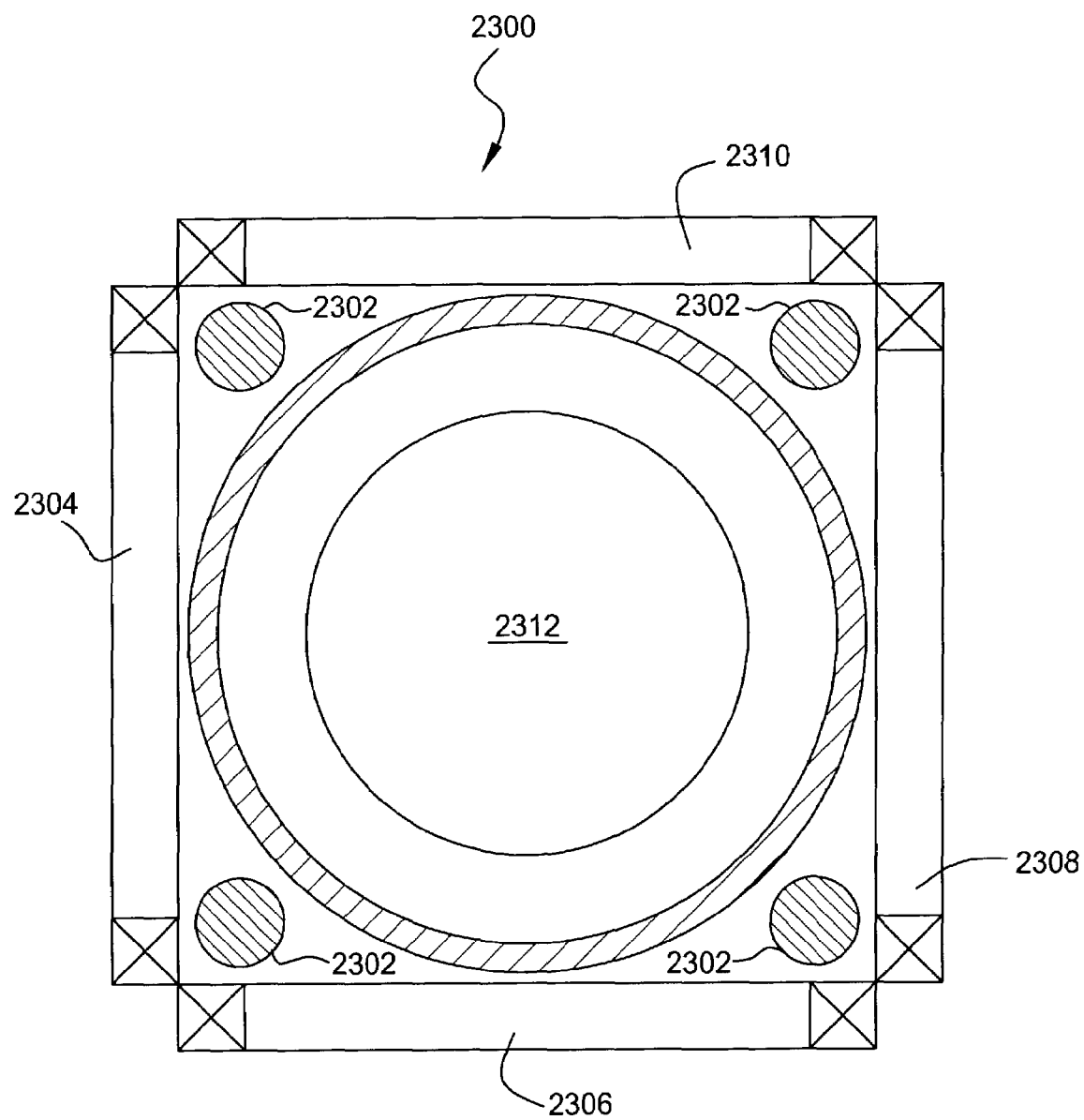
FIG. 19 depicts a schematic cross-sectional view of another embodiment of the invention having center shields.

FIG. 19 depicts a top, cross-sectional schematic view of a plasma chamber 2300 containing another embodiment of the invention. The invention comprises a plurality of center shields 2302 that form a magnetic field control element that is positioned centrally in the chamber 2300. Specifically, the shields 2302 are positioned between the coils 2304, 2306, 2308, 2310 and the pedestal 2312.

Figure 20:
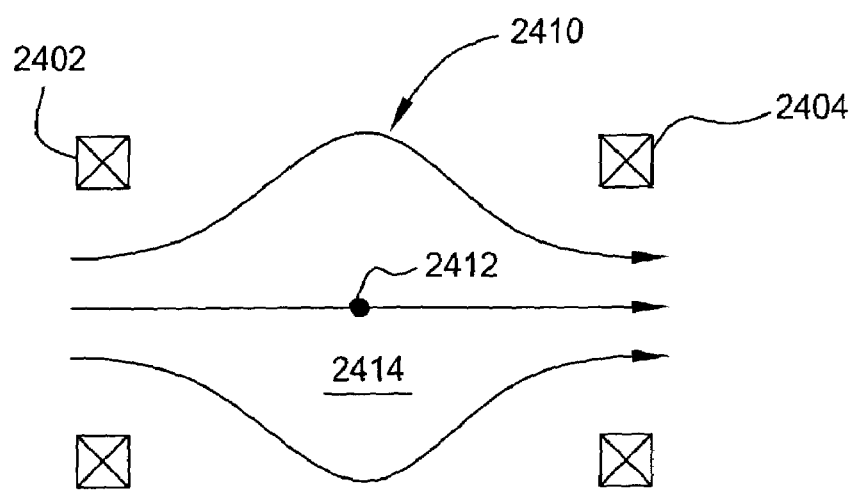
FIG. 20 depicts a schematic view of a pair or coils and the magnetic field the coils produce.
Figure 21:
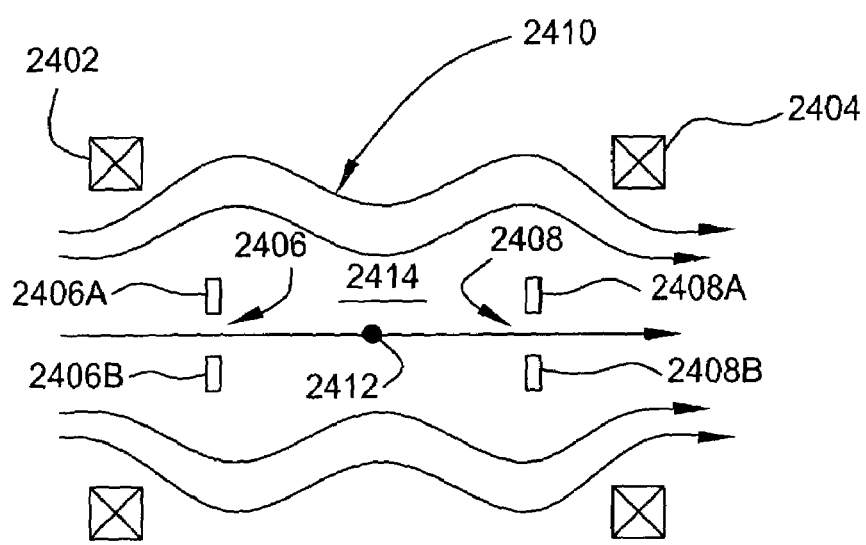
FIG. 21 depicts a schematic view of the coils of FIG. 20, a center shield and the magnetic field produced by the coils and altered by the center shield.

FIG. 20 depicts a simplified schematic view of a pair of coils 2402, 2404 and FIG. 21 depicts the pair of coils 2402, 2404 in addition to a pair of shield elements 2406, 2408. The shield elements have a length that is approximately as long as the coils are tall. In FIG. 20, the coils 2402, 2404 are driven with current that produces a magnetic field 2410. The lines of force of the field 2410 are close together near the coils and further apart near the center 2412 of a processing region 2414 (i.e., near the center of a wafer).

When the shield elements 2406, 2408 are added as shown in FIG. 21, the lines of force are bent to be more uniformly spaced near the center 2412 of processing region 2414 (i.e., near the center of the wafer). In the embodiment of FIG. 21, each of the shield elements 2406, 2408 comprise two rectangular plates 2406A, 2406B, 2408A, and 2408B, having a long axis substantially-perpendicular to the direction of the lines of force. The size and shape of the shield elements can be controlled to establish a uniform magnetic field in the center 2412 of the process region 2414.

In FIG. 19, four coils 2304, 2306, 2308, 2310 are positioned with one on each side of the chamber 2300. The shield elements 2302 are symmetrical (e.g., cylindrical) such that each individual element has a similar effect on the magnetic field produced by each neighboring coil. However, the elements can have an asymmetric shape to either compensate for asymmetries in the magnetic fields or to produce desirable asymmetries in the magnetic field.

The magnetic shield elements 2302 may be formed from materials such as ultra-low carbon steel, mu-metal, iron, nickel and the like.

While foregoing is directed to the preferred embodiment of the present invention, other and further embodiments of the invention may be devised without departing from the basic scope thereof, and the scope thereof is determined by the claims that follow.

The invention claimed is:

1. A magnetically enhanced plasma chamber comprising:
   a cathode pedestal for supporting a wafer within an enclosure having a top, bottom and sides;

a plurality of electromagnets, located around the sides of the enclosure, for producing a magnetic field within the enclosure; and a plurality of magnetic field control elements positioned proximate the plurality of electromagnets, for altering the magnetic field generated by the plurality of electromagnets near a selected region of the wafer, the control elements and electromagnets respectively arranged in pairs having the electromagnet circumscribing the control element.

2. The chamber of claim 1 wherein said magnetic field control elements comprise:

a plurality of counter coils, where one counter coil is positioned proximate to each of the electromagnets in said plurality of electromagnets and the counter coils produce a magnetic field that has an opposite direction to a direction of the magnetic field produced by the electromagnets.

3. The chamber of claim 2 wherein each of the electromagnets is associated with a counter coil, the electromagnets and counter coils are annular, the electromagnets have a diameter that is larger than the diameter of the counter coils where each electromagnet has one counter coil positioned within each of the electromagnets.

4. The chamber of claim 3 wherein the counter coils and the electromagnets have ears that are bent inward toward the enclosure.

5. The chamber of claim 3 wherein the electromagnets are planar and the counter coils have ears that are bent inward toward the enclosure.

6. The chamber of claim 2 wherein the counter coils produce a magnetic field at a center of the wafer having a magnitude that is less than a magnitude of a magnetic field at the center of the wafer produced by said electromagnets.

7. The chamber of claim 1 wherein the electromagnets are annular defining an opening and each of the magnetic field control elements comprise a magnetic shield positioned within the opening of each of the electromagnets.

8. The chamber of claim 7 wherein the magnetic shield comprises a substantially rectangular block of magnetic material.

9. The chamber of claim 7 wherein the magnetic shield comprises four bars arranged in a rectangle.

10. The chamber of claim 7 wherein the magnetic shield comprises a pair of bars.

11. The chamber of claim 7 wherein the pair of bars are oriented horizontally or vertically.

12. A magnetically enhanced plasma chamber comprising:

a cathode pedestal for supporting a wafer within an enclosure;

at least four electromagnet and counter coil pairs, located around an exterior of the enclosure, each electromagnet at least partially surrounding the paired counter coil, the electromagnets for producing a magnetic field within the enclosure; and the counter coils for altering a magnetic field at a specific region of the wafer and for producing a magnetic field that has an opposite direction to the direction of the magnetic field produced by the paired electromagnet.

13. The chamber of claim 12 wherein the electromagnets and counter coils are annular, and the electromagnets have a diameter that is slightly larger than the diameter of the counter coils, and wherein each electromagnet has one paired counter coil positioned within each of the electromagnets.

14. The chamber of claim 13 wherein the counter coils and the electromagnets have ears that are bent inward toward the enclosure.

15. The chamber of claim 13 wherein the electromagnets are planar and the counter coils have ears that are bent inward toward the enclosure.

16. The chamber of claim 12 wherein the counter coils produce a magnetic field at a center of the wafer having a magnitude that is less than a magnitude of a magnetic field at the center of the wafer produced by the electromagnets.

* * * * *